(12) United States Patent
Yamamoto et al.

(10) Patent No.: US 7,138,801 B2
(45) Date of Patent: Nov. 21, 2006

(54) NMR SPECTROMETER AND NMR PROBE

(75) Inventors: Hiroyuki Yamamoto, Kokubunji (JP);
Kazuo Saitoh, Kodaira (JP); Haruhiro Hasegawa, Kokubunji (JP); Hisaaki Ochi, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/192,081

(22) Filed: Jul. 29, 2005

(65) Prior Publication Data

US 2006/0119360 A1 Jun. 8, 2006

(30) Foreign Application Priority Data

Dec. 8, 2004 (JP) ............... 2004-354909

(51) Int. Cl.
*G01V 3/00* (2006.01)
(52) U.S. Cl. ........................ 324/318; 324/322
(58) Field of Classification Search ............... 324/318, 324/322
See application file for complete search history.

(56) References Cited

U.S. PATENT DOCUMENTS

| | | | |
|---|---|---|---|
| 5,173,678 A * | 12/1992 | Bellows et al. ........ | 505/211 |
| 5,247,256 A | 9/1993 | Marek | |
| 5,585,723 A | 12/1996 | Withers | |
| 6,201,392 B1 * | 3/2001 | Anderson et al. ........ | 324/300 |
| 6,943,550 B1 * | 9/2005 | Cheng et al. ........ | 324/318 |
| 6,958,608 B1 * | 10/2005 | Takagi et al. ........ | 324/318 |

FOREIGN PATENT DOCUMENTS

| | | |
|---|---|---|
| EP | 1 361 452 A2 | 12/2002 |
| EP | 1 361 452 A3 | 12/2002 |
| EP | 1 361 453 A1 | 5/2003 |

OTHER PUBLICATIONS

Odoj, F. et al., "A Superconducting Probehead Applicable for Nuclear Magnetic Resonance Microscopy at 7 T", Review of Scientific Instruments, vol. 69, No. 7, American Institute of Physics, (Jul. 1998), pp. 2708-2712.
European Search Report dated Dec. 9, 2005.

* cited by examiner

*Primary Examiner*—Louis M. Arana
(74) *Attorney, Agent, or Firm*—Reed Smith LLP; Stanley P. Fisher, Esq.; Juan Carlos A. Marquez, Esq.

(57) ABSTRACT

An NMR probe having a high-sensitivity solenoid probe coil for receiving free induction decay (FID) signals in nuclear magnetic resonance (NMR) spectroscopy, and an NMR spectrometer which incorporates this probe. The solenoid probe coil is fabricated by a building block approach where it mainly consists of coil substrates having superconducting thin film coils made from superconducting thin film thereon, and side holding plates and a wiring substrate with line pattern of superconducting thin films which are both perpendicular to the coil substrates. The superconducting thin film coils are connected with the line patterns of superconducting thin films by capacitive coupling to make the solenoid coil configuration and solenoid probe coil of superconducting material.

14 Claims, 20 Drawing Sheets

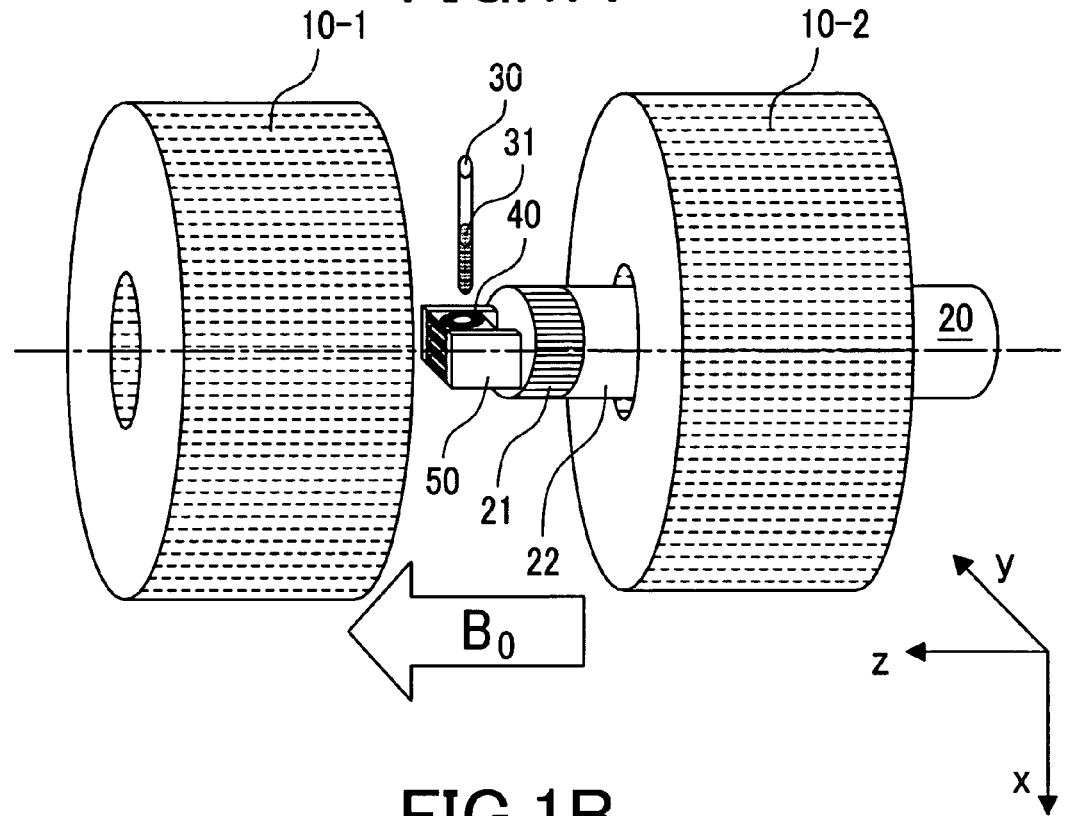
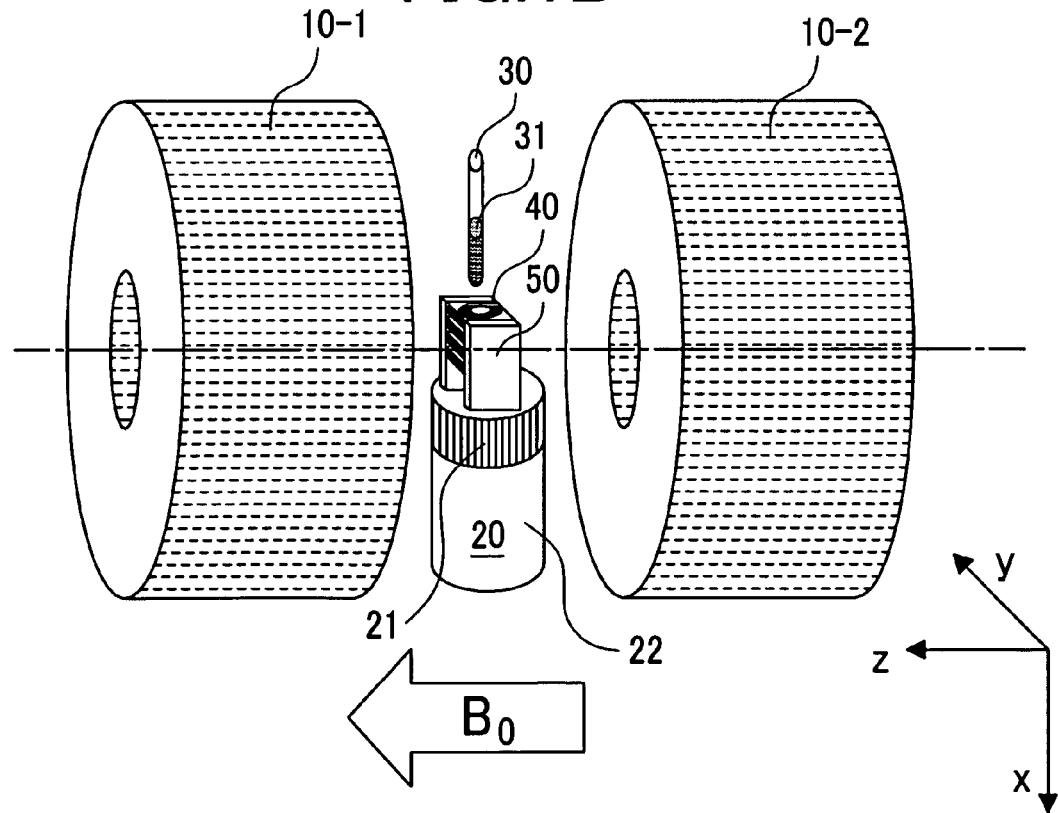

FIG.17
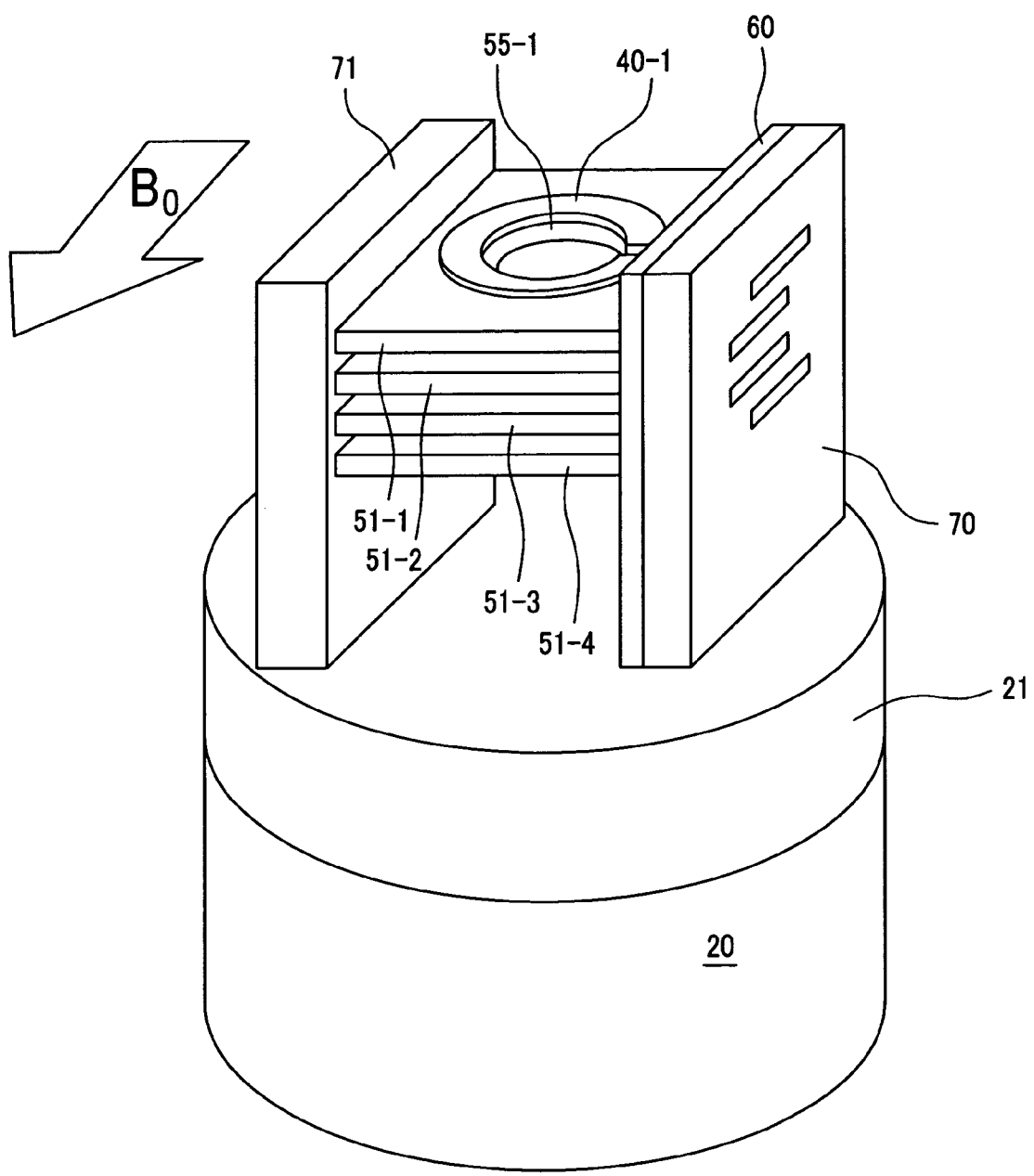
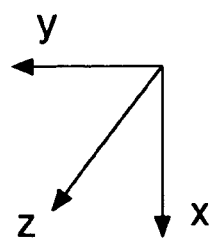

FIG.18
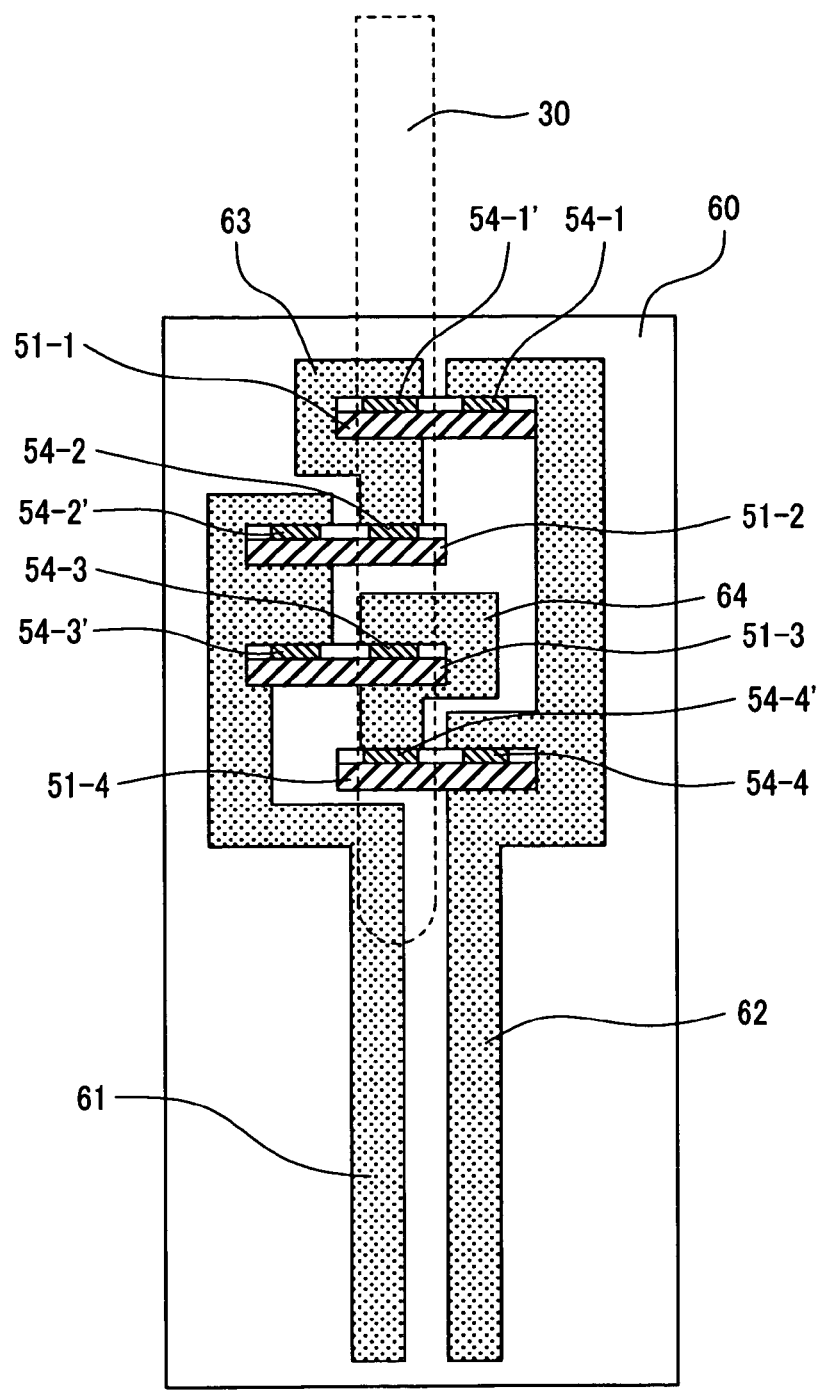
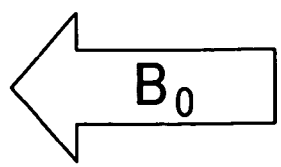

NMR SPECTROMETER AND NMR PROBE

CLAIM OF PRIORITY

The present application claims priority from Japanese application JP2004-354909 filed on Dec. 8, 2004, the content of which is hereby incorporated by reference into this application.

FIELD OF THE INVENTION

The present invention relates to a nuclear magnetic resonance spectrometer (hereinafter referred to as an "NMR spectrometer") and more particularly to an NMR spectrometer which is characterized by a solenoid probe coil configuration for transmitting radio frequency signals at a prescribed resonance frequency to a sample placed in a static magnetic field and/or receiving free induction decay (FID) signals.

BACKGROUND OF THE INVENTION

Nuclear magnetic resonance (NMR) spectroscopy, by which one can get atomic level information on matter, is an excellent method of analyzing the structure of a compound. The basic principle of analysis by this method is as follows: a sample placed in a static magnetic field is exposed to a radio frequency magnetic field and a response signal from the excited nuclear spin is received and analyzed. For high resolution analysis, an NMR spectrometer which has a superconducting magnet capable of generating a static magnetic field ($B_0$) is employed. Currently, a 21.6 T (920 MHz) NMR spectrometer is available as an NMR spectrometer which is primarily intended to analyze three-dimensional protein structures.

In protein analysis, the sample volume is very small and the intensity of generated free induction decay (FID) signals is weak. Therefore, a probe for receiving FID signals must be highly sensitive. As described in Patent Document 1 (U.S. Pat. No. 5,247,256 specification), a method which reduces thermal noise by the use of a probe at a low temperature to increase the probe sensitivity has been known. In addition, the use of a superconducting material for the probe coil is also effective in increasing the sensitivity. Surface resistance in superconducting materials is two or more digits lower than that in normal metals such as copper. Therefore, the use of a superconducting material reduces the surface resistance of the probe coil and enables reception of signals with a high sensitivity. An example of the use of a superconducting probe coil is described in Patent Document 2 (U.S. Pat. No. 5,585,723 specification).

Superconductor used for the probe coil is a thin film made on a planar substrate and the film surface is arranged parallel to a static magnetic field in order to prevent deterioration in static magnetic field uniformity due to the perfect diamagnetism of the superconductor. In a typical NMR spectrometer, a static magnetic field is generated vertically (vertical type NMR spectrometer). A sample tube containing sample is inserted vertically and a substrate with superconducting thin film is disposed in a way to surround the sample tube. Hence, the superconductor-based probe coils in the prior art are of the Helmholtz type, saddle type or bird cage type. A probe coil of the bird cage type is illustrated in Patent Document 3 (Japanese Patent No. 3066359 specification). On the other hand, an NMR spectrometer (horizontal type NMR spectrometer) which generates a static magnetic field horizontally can use a solenoid probe coil. Solenoid probe coils are higher in filling factor than Helmholtz type, saddle type or bird cage type probe coils and thus higher in sensitivity.

SUMMARY OF THE INVENTION

An object of the present invention is to provide an NMR spectrometer having a highly sensitive solenoid probe coil for receiving free induction decay (FID) signals in nuclear magnetic resonance (NMR) spectroscopy, and an NMR probe therefor.

The present invention is intended to provide an NMR spectrometer in which the sensitivity of the probe coil for receiving free induction decay (FID) signals in nuclear magnetic resonance (NMR) spectroscopy is improved and also provide an NMR probe therefor. In order to realize a high-sensitivity NMR spectrometer, two independent superconducting solenoid coils (split type superconducting magnet) and a solenoid probe coil (fabricated by processing a superconducting material) are required. In this case, for the split type superconducting magnet to generate a more uniform magnetic field, the two superconducting solenoid coils must be very close to each other. However, the distance between the two superconducting solenoid coils must be enough to allow insertion of a sample tube into the probe coil and also ensure space for the probe coil.

The probe coil can be placed between the two superconducting solenoid coils in two ways. One way is that it is inserted in the same direction as the sample tube (vertically to the static magnetic field) and the other is that it is inserted parallel to the static magnetic field, namely through the bore of a superconducting solenoid coil. In either case, the sample tube is inserted into the probe coil and therefore the distance between the two superconducting solenoid coils must be determined considering the size of the probe coil in which the sample tube is to be inserted.

When the probe coil is made of a superconducting material, a cooling system is needed. A more specific object of the present invention is to provide an NMR spectrometer with a cooling system and a probe configuration which takes heat transfer cooling, electrical connection and assemblability into consideration where the probe allows application of a radio frequency magnetic field and reception of FID signals, and an NMR probe configuration therefor.

The present invention employs the following constitution in order to realize a high-sensitivity NMR spectrometer. First, it adopts a split type superconducting magnet which is divided in half in order to generate a static magnetic field ($B_0$).

A probe coil (transmitter coil) is provided to supply a radio frequency signal with a resonance frequency to a static magnetic field between the two superconducting half magnets. In addition, a probe coil (receiver coil) is provided to receive a nuclear magnetic resonance signal from the sample in response to the supplied radio frequency signal. For high sensitivity NMR spectroscopy, the receiver coil uses a plurality of solenoid element coils which each have a superconducting thin film on a sapphire substrate, where the element coils are stacked and electrically interconnected so as to make up a required coil. The substrates on which the element coils are formed are fixed by side plates which support the multilayer structure. The element coils are electrically interconnected by a wiring substrate which is arranged in the same manner as the side plates. The line pattern for wiring on wiring substrate is made using a superconducting thin film.

Alternatively, the functions of both the transmitter coil and the receiver coil may be integrated into a single solenoid superconducting probe coil. Also, the substrate material may be aluminum nitride (AlN) instead of sapphire.

The cooling system is structured as follows: a member of oxygen free copper or sapphire or of a combination of these is connected with a heat exchanger or immersed in a liquid helium and cooled and the member is connected with a sapphire cold head. The cold head is connected with the above superconducting probe coil to cool the coil.

BRIEF DESCRIPTION OF THE DRAWINGS

The invention will be more particularly described with reference to the accompanying drawings, in which:

FIG. 1A is a perspective view showing the main components of an NMR spectrometer according to the present invention where a probe coil 50 is inserted into the bore of a split type superconducting magnet; and FIG. 1B is a perspective view showing the main components of an NMR spectrometer according to the present invention where the probe coil 50 is inserted in the same direction as a sample tube 30 (vertically to the static electric field);

FIG. 17 is a perspective view of a solenoid probe coil for NMR spectroscopy according to the fifth embodiment;

FIG. 18 illustrates line patterns of superconducting thin films 61 to 64 and connection pieces 54-1 to 54-4 and 54-1' to 54-4' of the four coil substrates 51-1 to 51-4 by way of example;

DETAILED DESCRIPTION OF THE PREFERRED EMBODIMENTS

Figure 2:
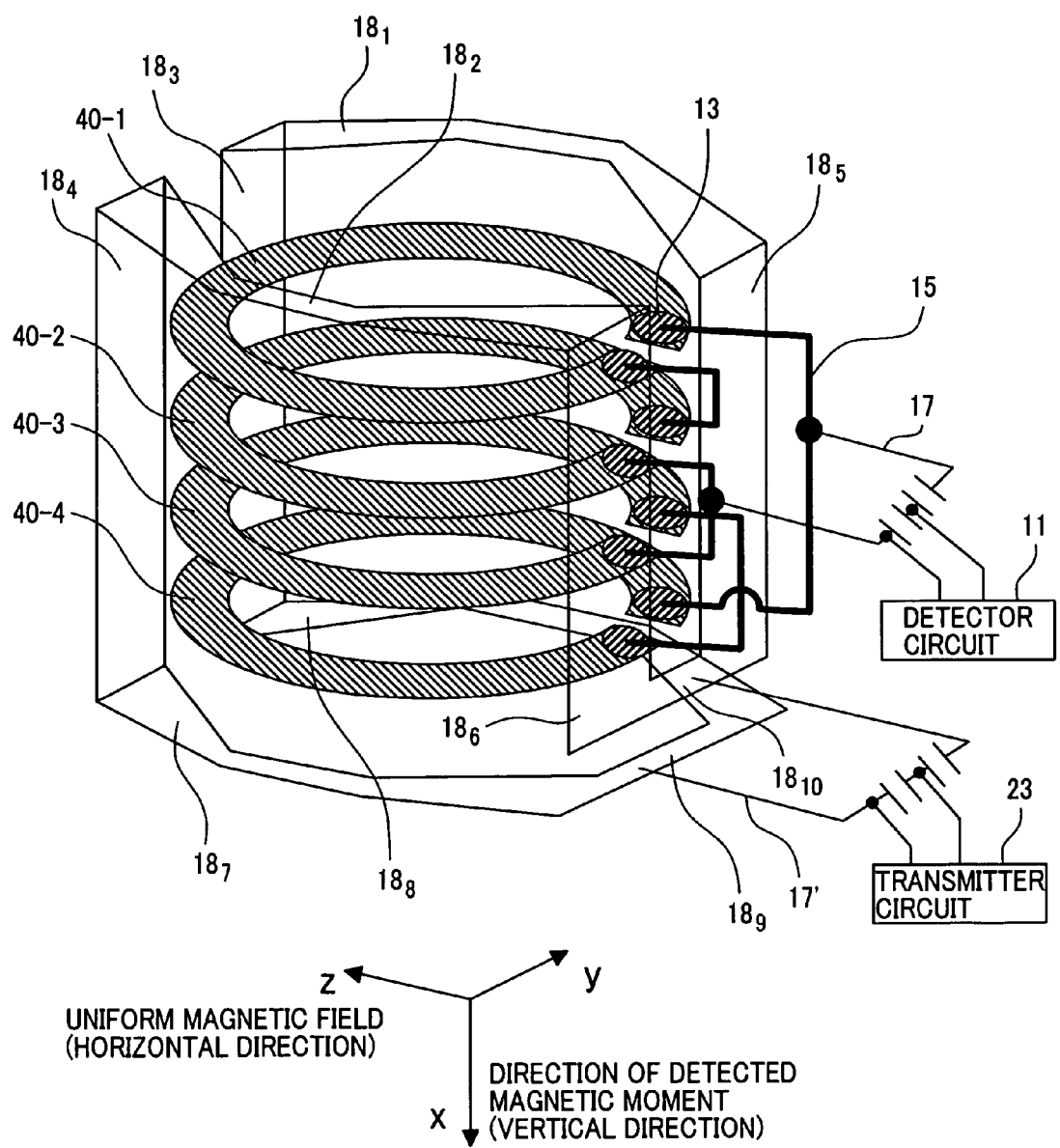
FIG. 2 is a perspective view which schematically shows the structure of the probe coil 50 which is applicable to the present invention.

The present invention relates to a nuclear magnetic resonance (NMR) spectrometer and concerns a probe coil configuration for transmitting radio frequency signals at a prescribed resonance frequency to a sample placed in a static magnetic field and receiving free induction decay (FID) signals.

A typical configuration of an NMR spectrometer according to the present invention will be described referring to FIGS. 1A and 1B.

FIG. 1A is a perspective view showing the main components of the NMR spectrometer according to the present invention where a probe coil 50 is inserted into the bore of a split type superconducting magnet; and FIG. 1B is a perspective view showing the main components of the NMR spectrometer according to the present invention where a probe coil 50 is inserted in the same direction as a sample tube 30 (direction vertically to the static electric field). Two superconducting half magnets 10-1 and 10-2 generate a 14.1 tesla (T) static magnetic field along the centerline expressed by dashed line. This magnetic field is indicated by arrow $B_0$. The sample tube 30, which contains sample 31, is inserted vertically to the static magnetic field (in the x direction in the figures). A cryogenic probe 20, which incorporates a solenoid superconducting probe coil (antenna coil) 50 for detecting a signal from the sample 31, is inserted in the same direction as the static magnetic field (FIG. 1A) or in the same direction as the sample tube 30 (FIG. 1B).

The cryogenic probe 20 includes: four substrates on each of which a superconducting 1 turn coil 40 (element coil) is formed; a superconducting solenoid coil 50 as a 2 turn, 2 parallel coil; a cold head 21 of sapphire or aluminum nitride (AlN) for conveying cold energy to it; and a cold lead 22 of oxygen-free copper for connecting the cold head 21 with the front end of a cooler as a cold energy source. In the present invention, the portion which includes the probe coil 50, the cold head 21 for conveying cold energy to it, and the cold lead 22 for connecting the cold head 21 with the front end of the cooler as the cold energy source is referred to as the cryogenic probe 20.

FIG. 2 is a perspective view which schematically shows the structure of the probe coil 50 which is applicable to the present invention. The probe coil consists of a transmitter coil for transmitting radio frequency signals to the sample and a receiver coil for detecting output signals from the sample. Since the receiver coil must have a higher sensitivity than the transmitter coil, it consists of a solenoid coil made of oxide superconductor thin film. On the other hand, the transmitter coil is a saddle type coil of normal metal which surrounds the receiver coil. A static magnetic field is applied horizontally and the solenoid coil detects the vertical component of the magnetic moment outputted from the sample.

In the figure, 40-1 to 40-4 represent 1 turn receiver coils made of oxide superconductor thin film which are each partially open. Four 1 turn receiver coils are provided parallel to each other. 13 represents oxide superconductor thin film which forms a capacitor by insertion of insulator at both ends of each oxide superconductor thin film 40. 15 represents a connection wire of oxide superconductor thin film which is resistively connected with the oxide superconductor thin film 13. This connects the connection wire of oxide superconductor thin film 15 and the oxide superconductor thin film 40 through the capacitor, thereby making up a required circuit. The coils 40-1 and 40-2 and the coils 40-3 and 40-4 are connected in series and these are connected in parallel so as to make up a receiver coil in the form of a 2 turn 2 parallel circuit. As shown in the figure, the sample tube 30 is inserted in the space surrounded by the four parallel receiver coils 40 which are connected with a detector circuit 11 through a normal metal leading wire 17.

$18_1$ to $18_{-10}$ are coil pieces for the transmitter coil which are assembled into a saddle type coil. The transmitter coil substantially consists of two 1 turn coils connected in parallel in a way to surround the receiver coil: namely a 1 turn coil composed of coil pieces $18_1$, $18_3$, $18_5$ and $18_8$ and a 1 turn coil composed of coil pieces $18_2$, $18_4$, $18_6$ and $18_7$. A large pulse current is supplied from a transmitter circuit 23 to the transmitter coil 18 through a normal metal leading wire 17' from the coil pieces $18_9$ and $18_{10}$ connecting the 1 turn coils so that the sample inserted in the space formed by the receiver coil generates a magnetic moment component perpendicular to the static magnetic field. This magnetic moment component perpendicular to the static magnetic field gradually relaxes and in this process, a signal from the sample is received by the receiver coil.

The receiver coil and a trimmer capacitor (not shown) placed in the cryogenic probe 20 constitute an LC resonance circuit, where (L) is the coil inductor, and (C) a capacitor between the oxide superconductor thin film coil 40 and the oxide superconductor thin film 13; and for higher detection sensitivity, the Q value of the LC resonance circuit must be increased. In order to increase the Q value, the parasitic resistance included in the LC resonance circuit must be decreased. For this reason, the present invention employs a superconductor for the solenoid coil.

In order to achieve high sensitivity, magnetic field uniformity must be increased. Superconductors have a property of perfect diamagnetism and provides a large magnetic susceptibility of $-1/4\pi$. In a first embodiment, in order not to disturb magnetic field distribution, a superconductor is arranged in a way that it does not intersect with the line of magnetic force as far as possible. In other words, a 1 turn coil of superconductor thin film is formed on a substrate and substrates of this type are stacked to make up a solenoid probe coil where the normal lines of the substrates are perpendicular to the static magnetic field and the superconductor intersected with the line of magnetic force is only a small portion of the thickness of the superconductor thin film.

Next, the present invention will be described in reference to several preferred embodiments thereof.

First Embodiment

Figure 3A:
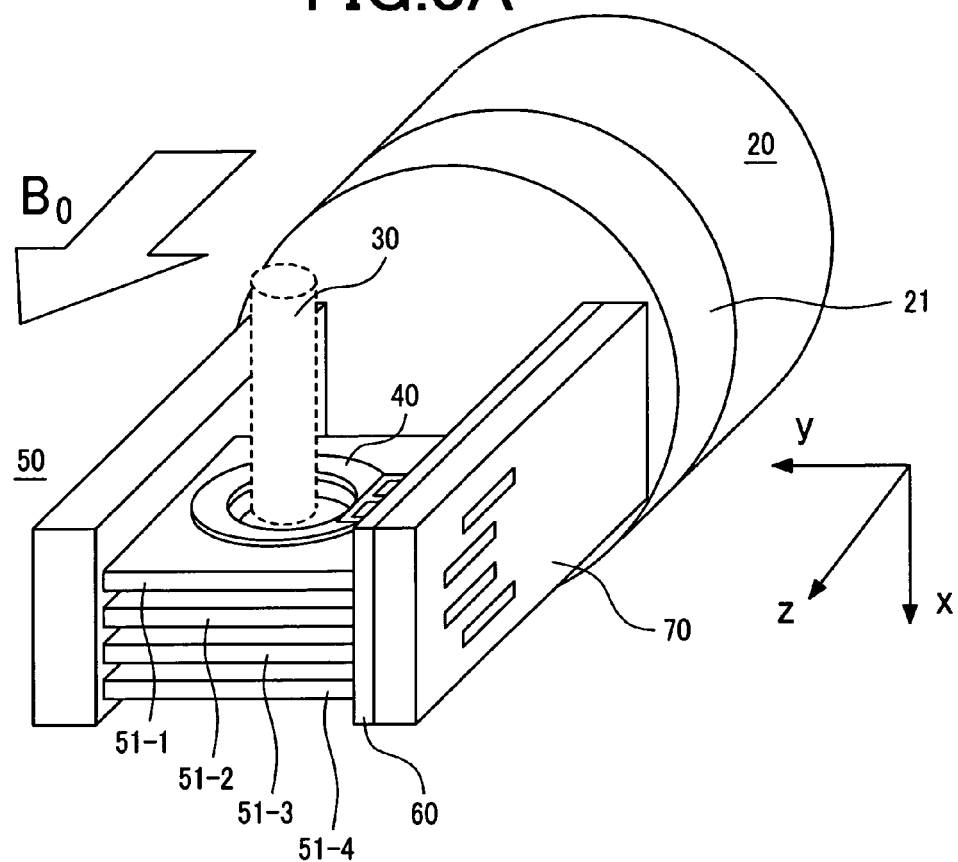
FIG. 3A is a perspective view of a solenoid probe coil for NMR spectroscopy according to a first embodiment of the present invention and FIG. 3B is a perspective view showing how its components are before they are assembled.
Figure 3B:
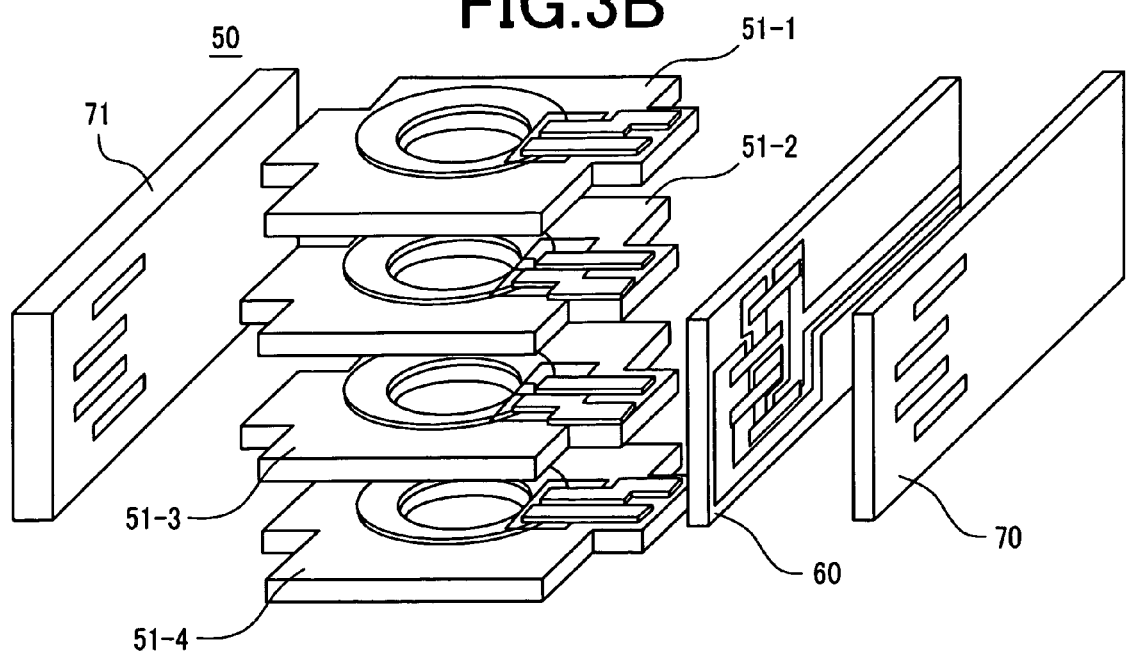

FIG. 3A is a perspective view of a solenoid probe coil for NMR spectroscopy according to the first embodiment of the present invention. In the first embodiment, an explanation of the transmitter coil is omitted to simplify the description. The cryogenic probe 20 is inserted horizontally to the static magnetic field (in the z-axis direction). For easy understanding, FIG. 3B shows how its components are before they are assembled.

In the first embodiment, the solenoid probe coil consists of: four coil substrates 51-1 to 51-4 on each of which a 1 turn coil of superconducting thin film 40 is formed; a wiring substrate 60 for electrical connection between the superconducting thin film coils 40; and two side holding plates 70 and 71 for fixing them. The side holding plate 71, located on the left of the stacked coil substrates 51-1 to 51-4, has holes into which the left projections of the substrates 51-1 to 51-4 are inserted. The wiring substrate 60 and the side holding plate 70, located on the right of the stacked coil substrates 51-1 to 51-4, have holes into which the right projections of the coil substrates 51-1 to 51-4 are inserted, like the side holding plate 71. On a surface of the wiring substrate 60, there are wiring patterns of superconducting thin film which are connected with the connection pieces of superconducting thin film on the coil substrates 51-1 to 51-4 to complete a prescribed circuit configuration. Next, various components will be described. In FIG. 3A, broken line 30 indicates where the sample tube 30 is to be inserted. In the subsequent figures, broken line 30 also indicates where the sample tube 30 is to be inserted.

Figure 4A:
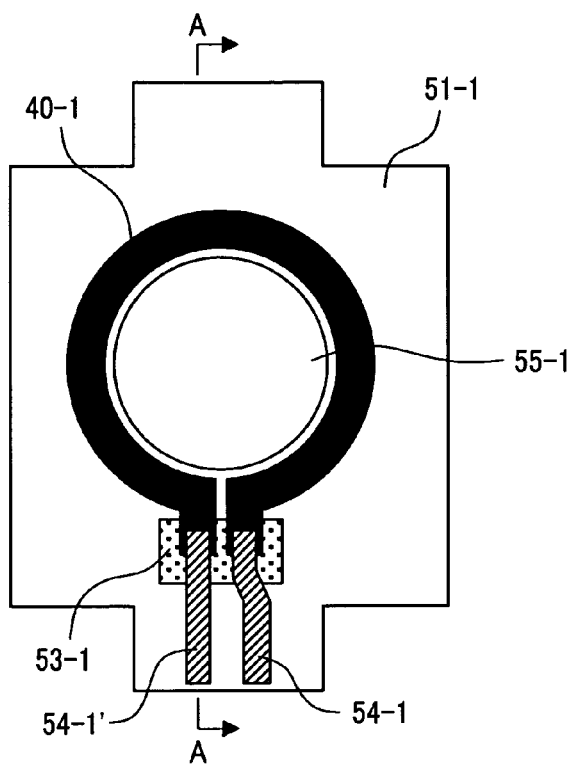
FIG. 4A is a top view of a coil substrate 51-1.
Figure 4B:
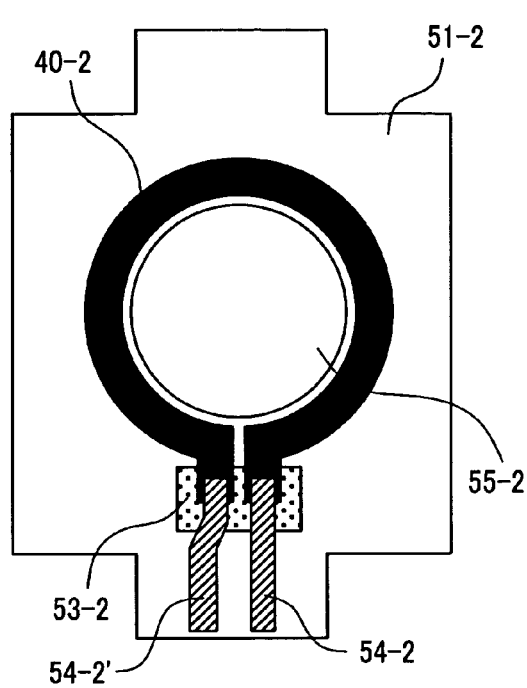
FIG. 4B is a top view of a substrate with a superconducting thin film coil 51-2.
Figure 4C:
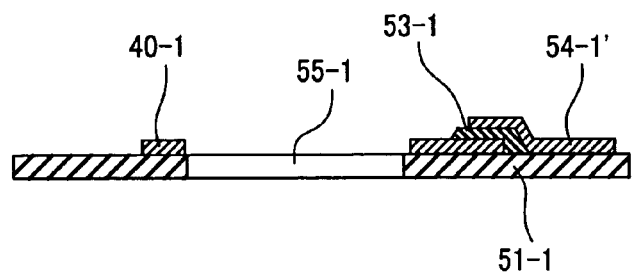
FIG. 4C is a sectional view of the coil substrate 51-1 taken along the line A—A in the direction of arrow.

FIG. 4A and FIG. 4B are top views of the coil substrates 51-1 and 51-2 respectively and FIG. 4C is a sectional view of the coil substrate 51-1 taken along the line A—A in the direction of arrow. The two coil substrates 51-1 and 51-2 are basically equal in structure but the positions of the projections of the substrates 51-1 and 51-2 and the shapes of the connection pieces 54-1, 54-1', 54-2, and 54-2' for interlayer connection are different. In the first embodiment, the coil substrate 51-3 is equal in shape to the coil substrate 51-2 and the coil substrate 51-4 is equal in shape to the coil substrate 51-1.

Taking the coil substrate 51-1 as an example, the structure of a coil substrate and a manufacturing method thereof will be explained below. The coil substrate 51-1 is composed of a superconducting thin film coil 40-1, an insulator thin film 53-1 and connection pieces of superconducting thin films 54-1, 54-1'. First, a $MgB_2$ superconducting thin film with a thickness of 200 nm is made on the coil substrate 51-1 by an evaporation method. The material of the substrate is sapphire. Then, a washer type superconducting thin film coil 40-1 is made by patterning using photolithography and electron cyclotron resonance etching. The coil 40-1 is partially cut open and extended toward the outside of the coil. Then, an AlN insulator thin film with a thickness of 400 nm is made only on the extended area of the superconducting thin film coil 40-1 by sputtering using a metal mask. After that, a $MgB_2$ superconducting thin film is made on the AlN insulating thin film using a metal mask similarly and connection pieces of superconducting thin films 54-1 and 54-1' are made by patterning using photolithography and electron cyclotron resonance etching.

With the above procedure, a thin film capacitor as a multilayer structure of $MgB_2/AlN/MgB_2$ is formed at the open ends of the superconducting thin film coil 40-1. Lastly, laser light irradiation is done to make a hole 55-1 (into which the sample tube 30 containing sample is inserted) and finish the contour of the coil substrate 51-1.

Figure 5A:
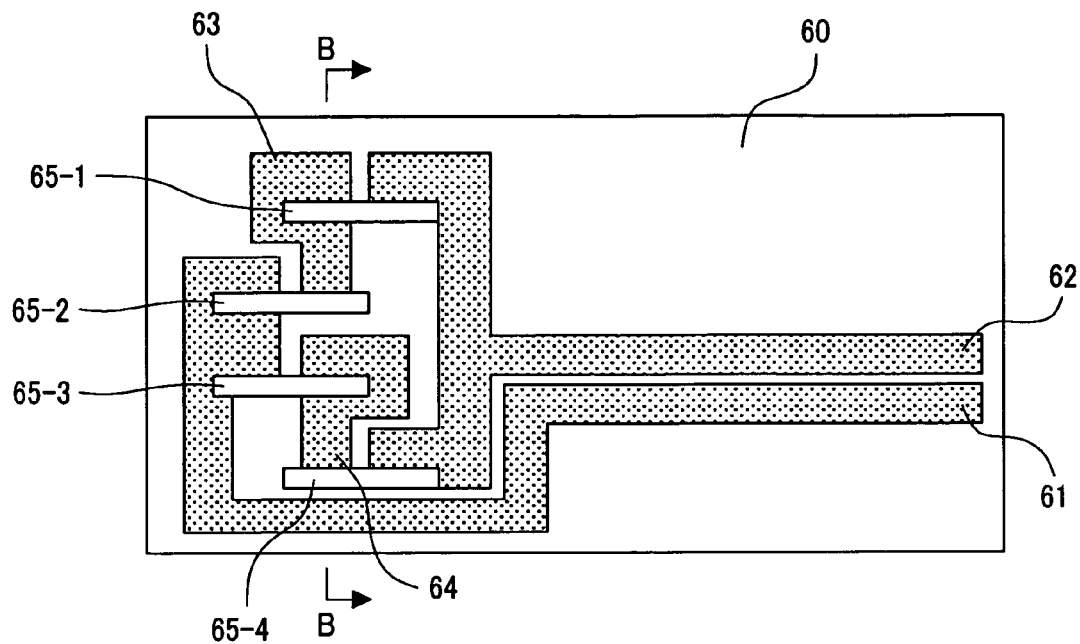
FIG. 5A is a plan view of a wiring substrate 60 and FIG. 5B is a sectional view of the substrate 60 taken along the line B—B in the direction of arrow.
Figure 5B:
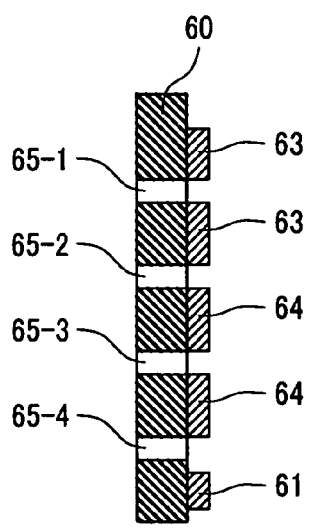

FIG. 5A is a plan view of the wiring substrate 60 and FIG. 5B is a sectional view of the substrate 60 taken along the line B—B in the direction of arrow. The line patterns of superconducting thin films 61 to 64 are formed on the substrate 60. In addition, holes 65-1 to 65-4 are made for insertion of the four coil substrates 51-1 to 51-4. The line patterns of superconducting thin films 61 to 64 are so patterned as to allow series-parallel connection of the four coil substrates 51-1 to 51-4. Next, a method of fabricating the wiring substrate 60 will be explained.

A $MgB_2$ superconducting thin film with a thickness of 200 nm is made on the wiring substrate 60 by an evaporation method. The material of the substrate 60 is sapphire. Then, line patterns for wiring made from the superconducting thin film by photolithography and electron cyclotron resonance etching. Lastly, four holes 65-1 to 65-4 are made by laser light irradiation. The side holding plates 70 and 71 are made of the same material as the substrates, namely sapphire. The thickness of the side holding plate 71 is equal to the sum of that of the side holding plate 70 and that of the supreconducting wiring substrate 61. Also, holes are made in the side holding plates 70 and 71 by laser light irradiation like the holes 65-1 to 65-4 in the wiring substrate.

As can be understood by comparison of FIG. 5A, FIG. 4A and FIG. 4B, the projection of the coil substrate 51-1 matches the hole 65-1 while the projection of the coil substrate 51-2 matches the hole 65-2. Therefore, when these coil substrates are properly set in the side holding plates 70 and 71 and the wiring substrate 60, the connection pieces of superconducting thin films on the substrates and the line patterns of superconducting thin films are connected so as to make up a prescribed circuit configuration. For example, the connection pieces of superconducting thin films 54-1 and 54-1' on the coil substrate 51-1 (one projection of which is inserted into the hole 65-1) are connected with the line patterns of superconducting thin films 62 and 63 respectively and the connection pieces of superconducting thin film 54-2 and 54-2' on the coil substrate 51-2 (one projection of which is inserted into the hole 65-2) are connected with the line patterns of superconducting thin films 63 and 61 respectively. As a consequence, the coil 40-1 of the coil substrate 51-1 and the coil 40-2 of the coil substrate 51-2 are connected in series.

Figure 6:
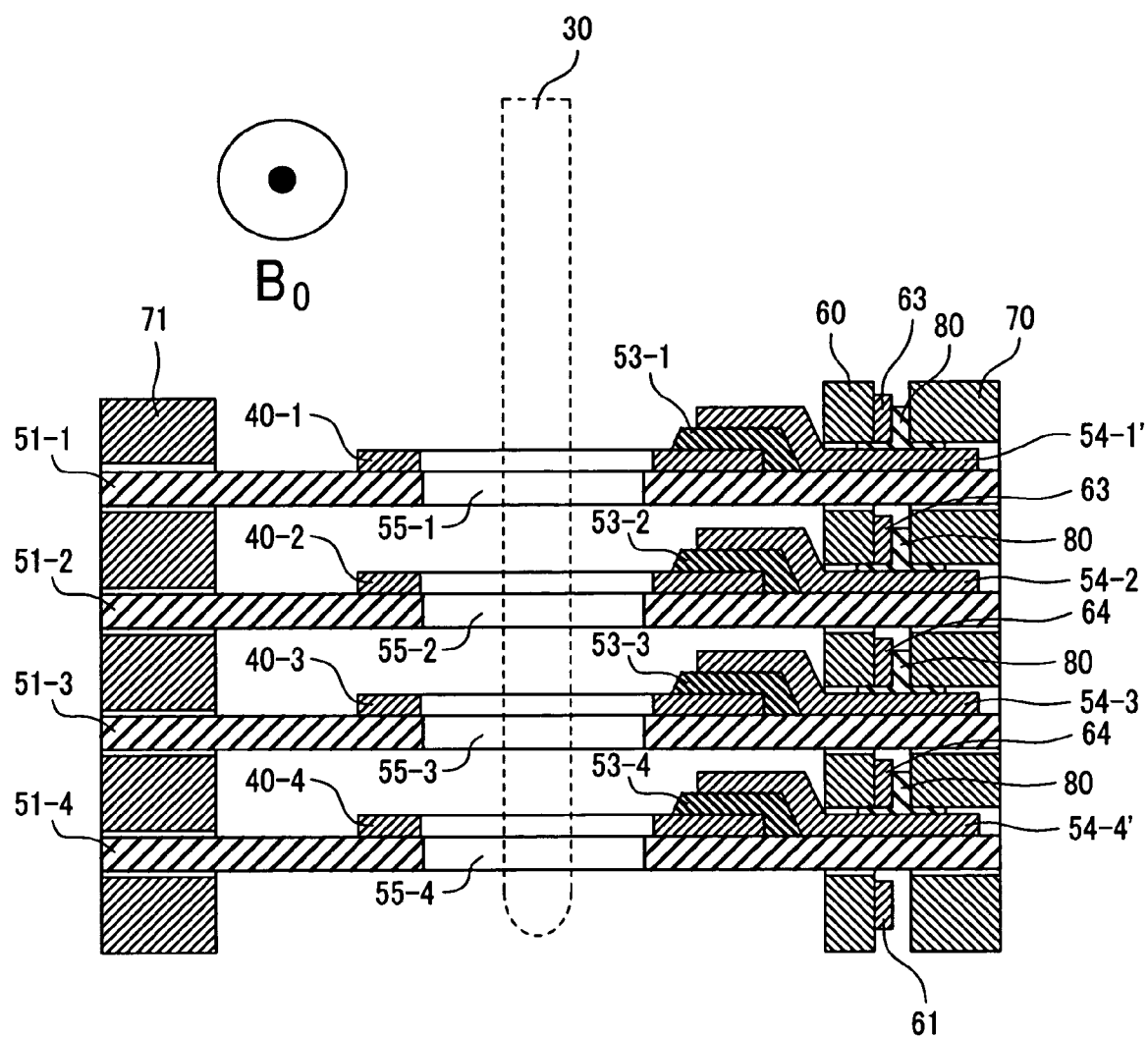
FIG. 6 is a sectional view of coil substrates 51-1 to 51-4 assembled with the wiring substrate 60 and side holding plates 70 and 71, taken along the line A—A of FIG. 4A (or line B—B of FIG. 5A) in the direction of arrow.
Figure 7:
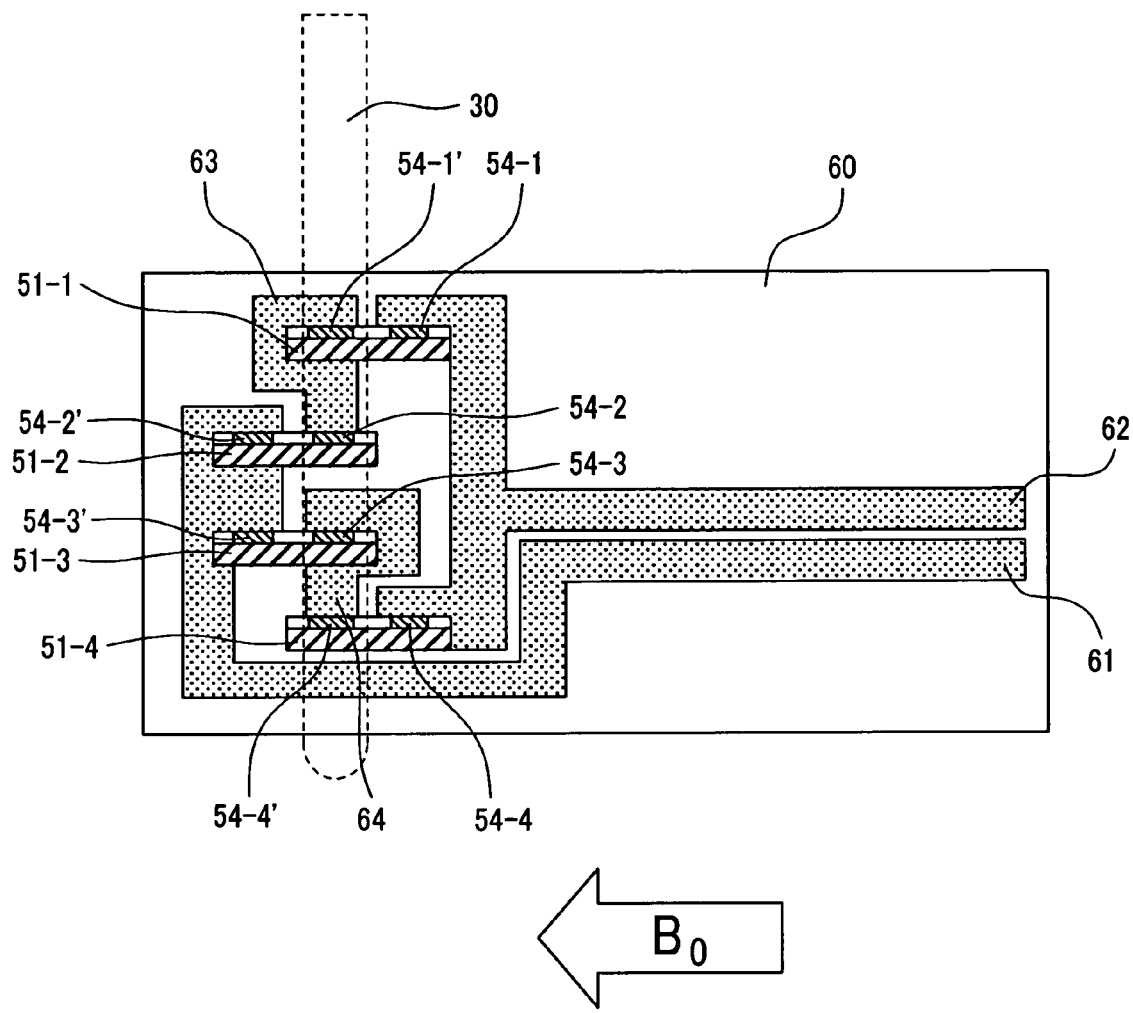
FIG. 7 is a plan view of the assembly with the side holding plate 70 (shown in FIG. 6) removed.

FIG. 6 is a sectional view of the solenoid coil assembled with the coil substrates 51-1 to 51-4, the wiring substrate 60 and side holding plates 70 and 71, taken along the line A—A of FIG. 4A (or line B—B of FIG. 5A) in the direction of arrow. FIG. 7 is a plan view of the assembly with the side holding plate 70 (FIG. 6) removed.

In order to suppress magnetic field disturbance caused by a superconducting thin film, the coil substrates 51-1 to 51-4 and the wiring substrate 60 are arranged parallel to the static magnetic field $B_0$. As described earlier, the projections of the coil substrates 51-1 to 51-4 at both sides are inserted into the holes of the wiring substrate 60 and two side holding plates 70 and 71 and fixed. FIG. 6 shows a gap between the holes and the coil substrates 51-1 to 51-4. For example, this gap is thermally filled by indium deposition and mechanically strengthened. The wiring substrate 60 and side holding plates 70 and 71 are connected with the cold head at the probe body tip, and the wiring substrate 60 and the coil substrates 51-1 to 51-4 are cooled to approx. 5K by heat transfer from the cold head 21.

As shown on the right in FIG. 6, an adequate electrical connection is made between connection pieces 54-1', 54-2, 54-3, 54-4' and the line patterns of superconducting thin films 61 to 64 by deposition of indium 80. As can be better understood from FIG. 7, the connection pieces 54-1' and 54-2 are connected by line pattern 63; the connection pieces 54-2' and 54-3' are connected by line pattern 61; the connection pieces 54-3 and 54-4' are connected by line pattern of superconducting thin film 64; and the connection pieces 54-1 and 54-4 are connected by line pattern 62. The line patterns 61 and 62 are led along the wiring substrate 60 to the cold head 21, then connected with a lead wire of normal material (not shown) there, led through the cold head 21, electrically connected with a trimmer capacitor for tuning/matching at the front end of the cryogenic probe 20 and led to the detector circuit 11.

Figure 8:
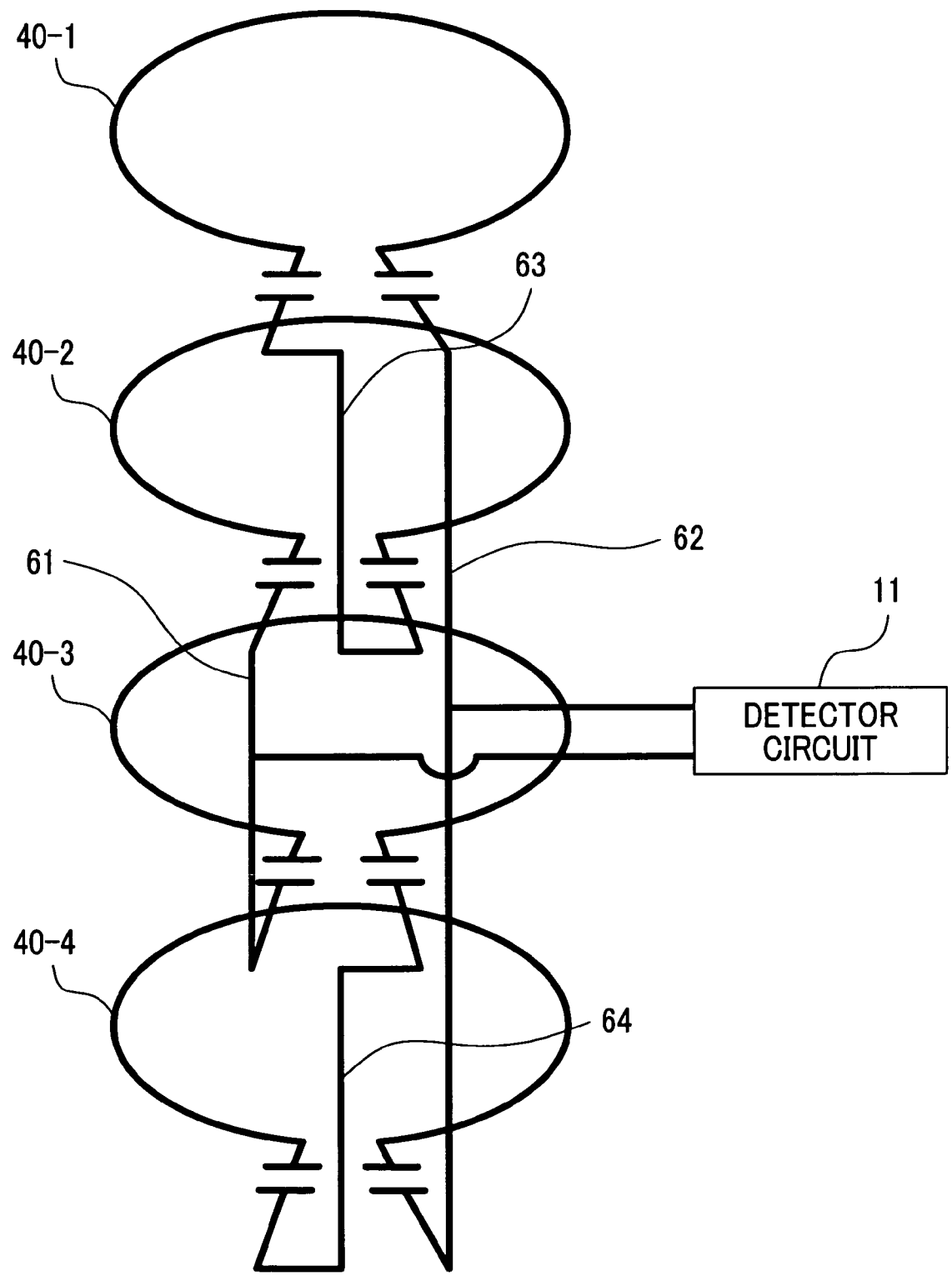
FIG. 8 shows an electrically equivalent circuit of the four coil substrates 51-1 to 51-4 which are composed of the line patterns of superconducting thin films 61 to 64 of the wiring substrate 60 as described in reference to FIGS. 6 and 7.

FIG. 8 shows electrically equivalent circuit which is composed of four superconducting coils 40-1 to 40-4 on the coil substrates 51-1 to 51-4 and the line patterns of superconducting thin films 61 to 64 on the wiring substrate 60 as described in reference to FIGS. 6 and 7. In the first embodiment, a 2 turn 2 parallel solenoid coil is realized.

In the first embodiment, the solenoid probe coil uses superconductor for all conductors (except indium) including the four coils surrounding the sample tube, connection pieces of thin film capacitor, wiring patterns for connection between the coils, and wiring to the trimmer capacitor at the probe tip. Therefore, resistance loss in the probe coil is remarkably reduced and a very high sensitivity can be achieved. As a result of evaluating the prepared probe coil at 600 MHz, it was found that the sensitivity is 3.5 times higher than when copper coil (normal conductor) is used.

The first embodiment uses $MgB_2$ as the superconducting thin film material. Similar result was obtained when an oxide high-temperature superconductor such as YBCO was employed for the same structure. It is obvious that similar result will be obtained even if Nb, Pb, NbTi or alloy of these is used as the superconducting material.

Also, when aluminum nitride (AlN) was used for the coil substrates 51-1 to 51-4, wiring substrate 60 and side holding plates 70 and 71, the result was similar.

Second Embodiment

Figure 9A:
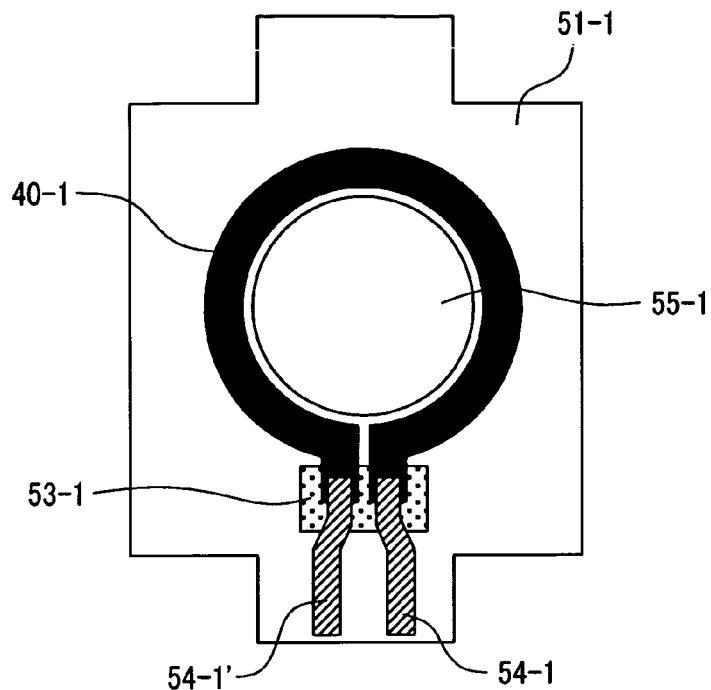
FIG. 9A is a plan view of a solenoid probe coil for NMR spectroscopy according to a second embodiment.
Figure 9B:
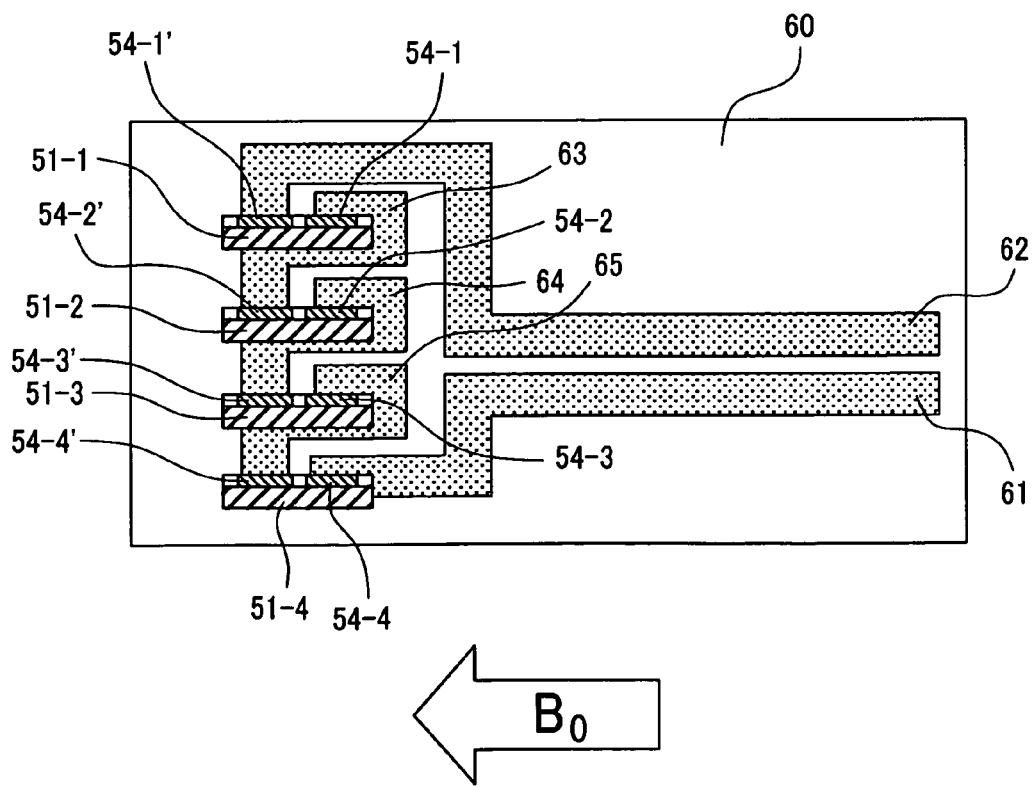
FIG. 9B is a side view of the wiring substrate 60 in assembled form, with a side holding plate removed.

FIG. 9A is a plan view of a solenoid probe coil for NMR spectroscopy according to the second embodiment; and FIG. 9B is a side view of the wiring substrate 60 in assembled form, with a side holding plate removed. What is shown in FIG. 9A corresponds to FIGS. 4A and 4B for the first embodiment while what is shown in FIG. 9B corresponds to FIG. 7 for the first embodiment. In the second embodiment, the cryogenic probe 20 is inserted horizontally to the static magnetic field, as well as in the first embodiment. In the second embodiment, the basic structure of the coil substrates 51-1 to 51-4 is the same as the one shown in FIGS. 4A and 4B for the first embodiment except that all the coil substrates 51-1 to 51-4 are same in form and the connection pieces 54-1 to 54-4' are same in pattern. The used materials, the fabrication methods of various components, and assembling and connection procedures are the same as in the first embodiment.

The line patterns of superconducting thin films of the wiring substrate 60 are different from those in the first embodiment: in the second embodiment, there are line patterns of superconducting thin films 63, 64 and 65 which connect the right connection piece of an upper coil substrate to the left connection piece of a next (lower) coil substrate, and the left connection piece of the top coil substrate and the right connection piece of the bottom coil substrates are used for line patterns 62 and 61 respectively.

Figure 10:
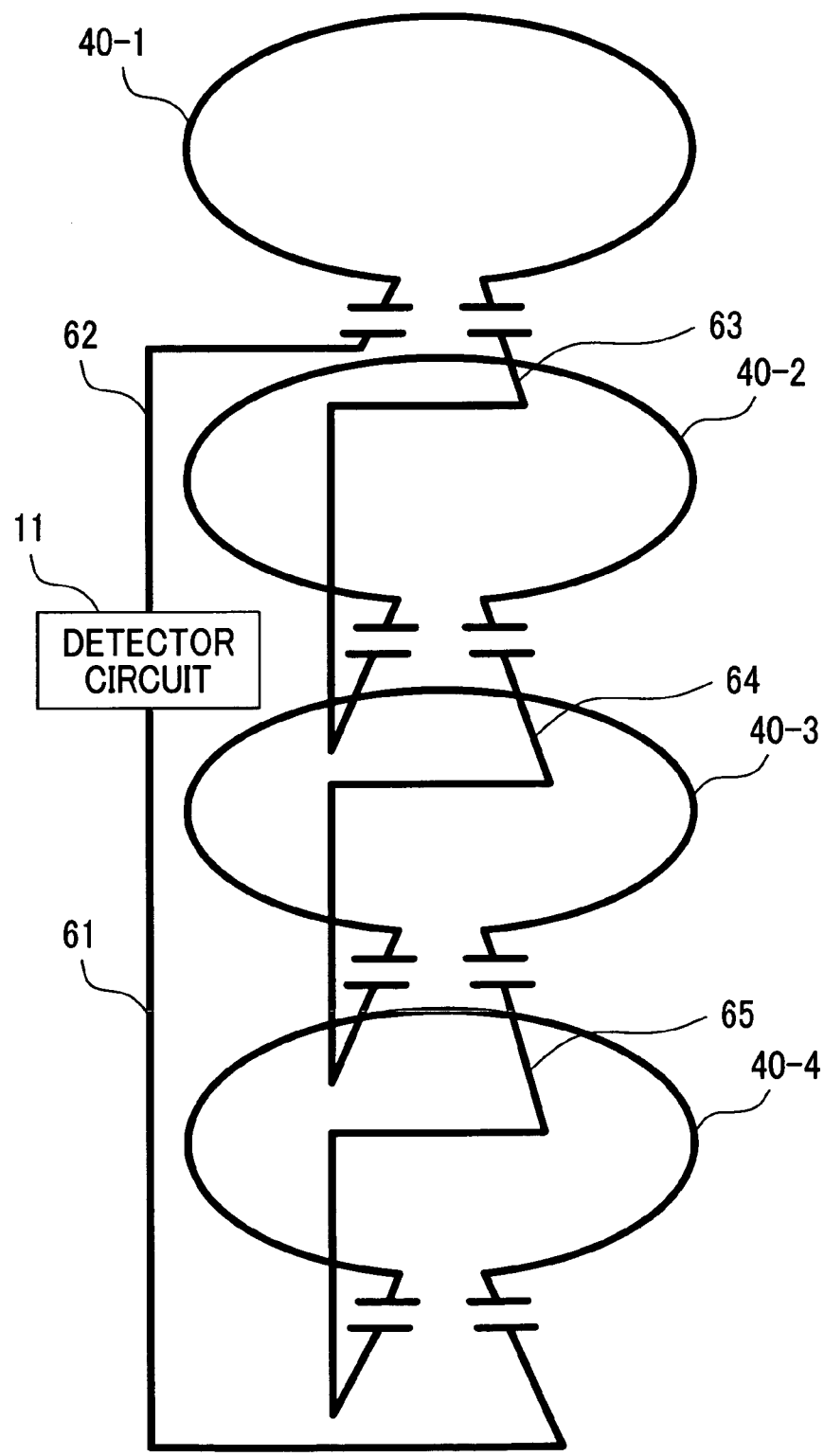
FIG. 10 shows an electrically equivalent circuit of the probe coil according to the second embodiment.

FIG. 10 shows electrically equivalent circuits of the probe coil according to the second embodiment. The second embodiment realizes a 4 turn 1 series solenoid coil.

As a result of evaluating the prepared 4 turn 1 series solenoid coil at 600 MHz, it was found that the sensitivity is 3.5 times higher than when normal metal coil is used.

Also the second embodiment uses $MgB_2$ as the superconducting thin film material. Similar result was obtained when an oxide high-temperature superconductor such as YBCO was employed for the same structure. Also, when aluminum nitride (AlN) was used for the coil substrates 51, wiring substrate 60 and side holding plates 70 and 71 instead of sapphire, the result was similar.

Third Embodiment

Figure 11A:
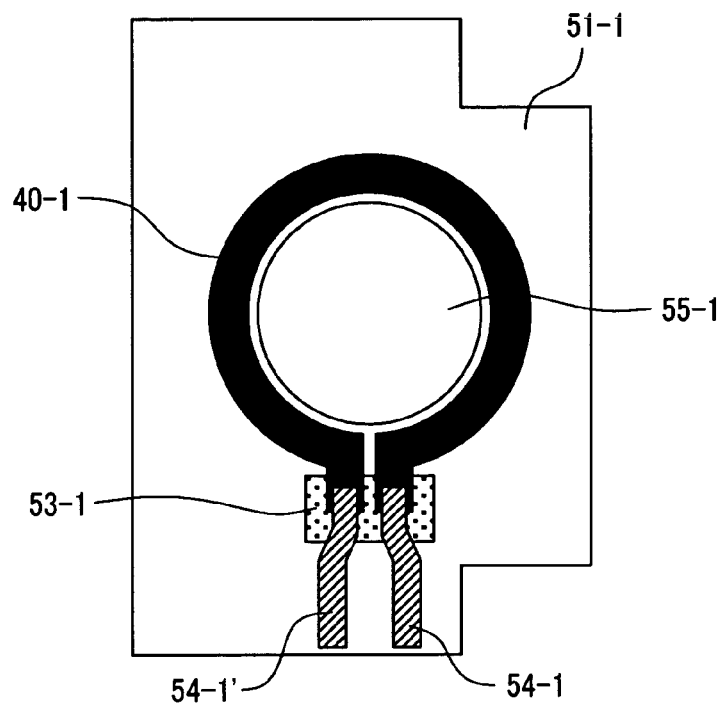
FIG. 11A is a plan view of a solenoid probe coil for NMR spectroscopy according to a third embodiment.
Figure 11B:
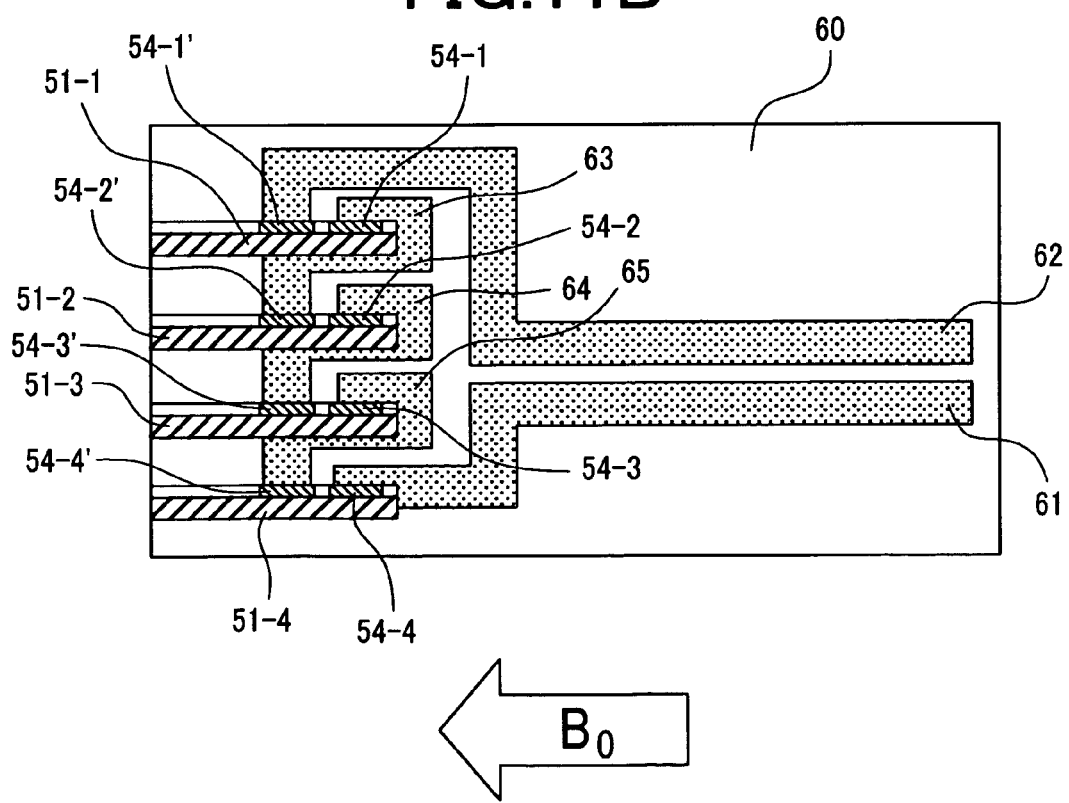
FIG. 11B is a side view of the wiring substrate 60 in assembled form, with a side holding plate removed.

FIG. 11A is a plan view of a solenoid probe coil for NMR spectroscopy according to the third embodiment; and FIG. 11B is a side view of the wiring substrate 60 in assembled form, with a side holding plate removed. What is shown in FIG. 11A corresponds to FIG. 9A for the second embodiment while what is shown in FIG. 11B corresponds to FIG. 9B for the second embodiment. In the third embodiment, the cryogenic probe 20 is inserted horizontally to the static magnetic field, as in the first and second embodiments. In the third embodiment, the basic structure of the coil substrates 51-1 to 51-4 is the same as shown in FIG. 9A for the second embodiment except that the projections of all the coil substrates 51-1 to 51-4 are replaced by those shown here where only the right upper and lower corners are cut. The patterns of the connection pieces 54-1 to 54-4' are the same as in the second embodiment. The used materials, the fabrication methods of various components, and assembling and connection procedures are the same as in the first embodiment.

The line patterns of superconducting thin films 61 to 65 of the wiring substrate 60 are the same as in the second embodiment but the holes 65-1 to 65-4 as described in reference to FIGS. 5A and 5B are extended by cutting the wiring substrate 60 up to its left end. The side holding plates 70 and 71 are also modified similarly, though not shown. This means that in the third embodiment, the coil substrates 51-1 to 51-4 can be assembled by pushing them into the wiring substrate 60 and side holding plates 70 and 71 from left. This fabrication method is easier than the method in which their projections are inserted into the holes.

As apparent by comparison between FIG. 11B and FIG. 9B, the line patterns of the wiring substrate are the same, so the third embodiment also realizes a 4 turn 1 series solenoid coil with the same equivalent circuits as shown in FIG. 10.

As a result of evaluating the prepared 4 turn 1 series solenoid coil at 600 MHz, it was found that the sensitivity is 3.5 times higher than when normal metal coil is used. Also the third embodiment uses $MgB_2$ as the superconducting thin film material. Similar result was obtained when an oxide high-temperature superconductor such as YBCO was employed for the same structure. Also, when aluminum nitride (AlN) was used for the coil substrates 51, wiring substrate 60 and side holding plates 70 and 71 instead of sapphire, the result was similar.

Fourth Embodiment

The fourth embodiment is different from the first to third embodiments as follows: while in the first to third embodiments the coils 40 is connected with the line pattern of superconducting thin film on the wiring substrate 60 by capacitively coupling the connection pieces 54 to the ends of the coils 40, in the fourth embodiment this connection is made by capacitive coupling between the extensions of the ends of the coils 40 and the line pattern of superconducting thin film on the wiring substrate 60.

Figure 12A:
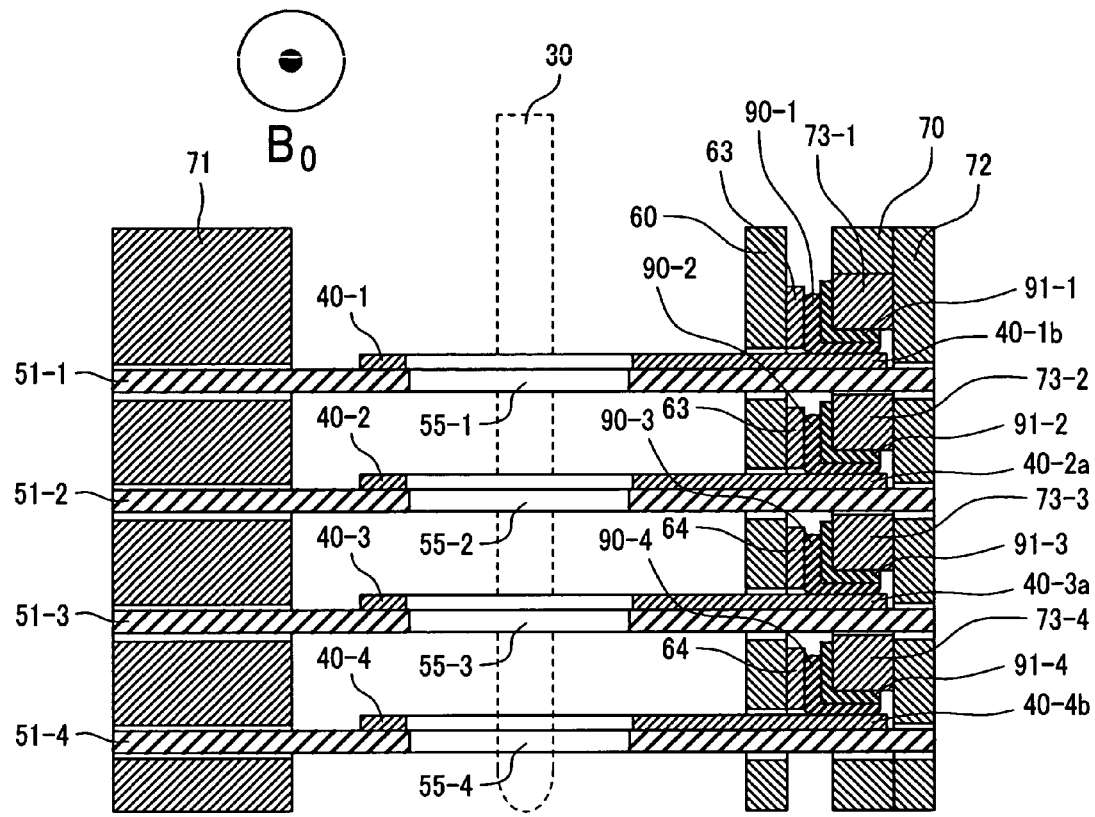
FIG. 12A is a sectional view which shows the coil substrates 51-1 to 51-4 assembled with the wiring substrate 60, side holding plates 70 and 71 and supporting plate 72, in the same manner as FIG. 6 for the first embodiment.
Figure 12B:
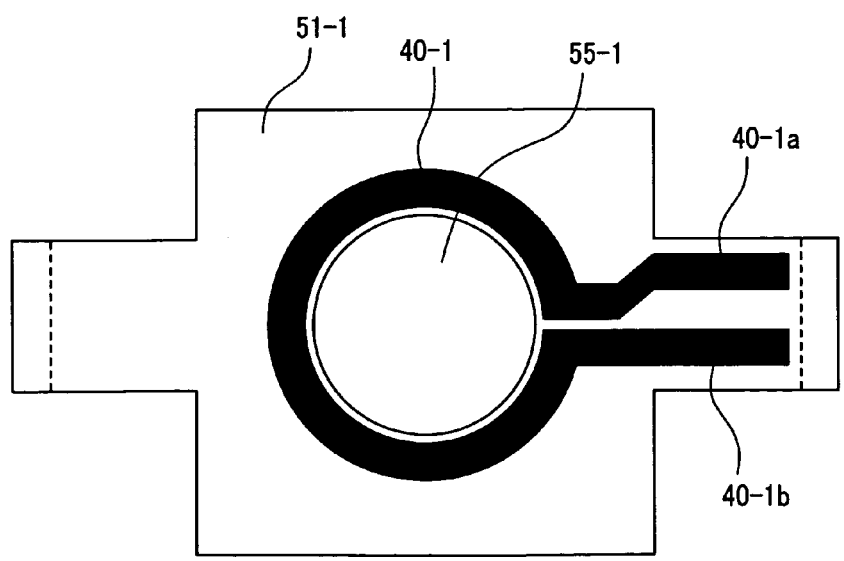
FIG. 12B is a plan view of the coil substrate 51-1 in the fourth embodiment.
Figure 13A:
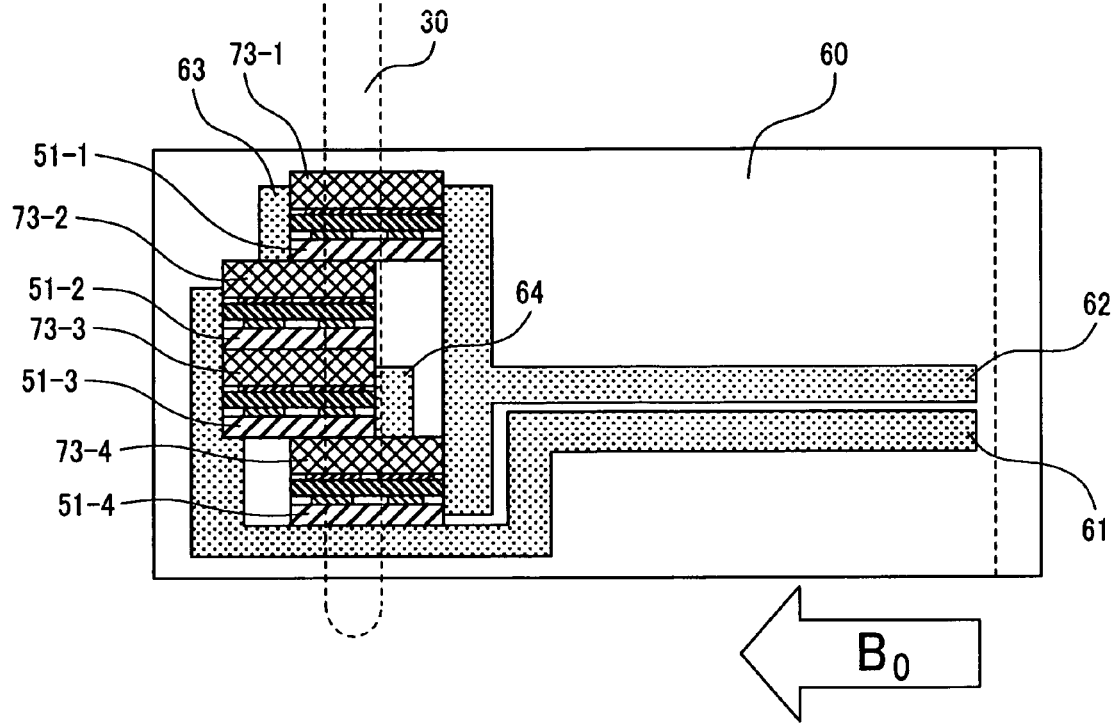
FIG. 13A is a plan view which shows the wiring substrate 60 with the side holding plate 70 and supporting plate 72 removed, in the same manner as FIG. 7 for the first embodiment.
Figure 13B:
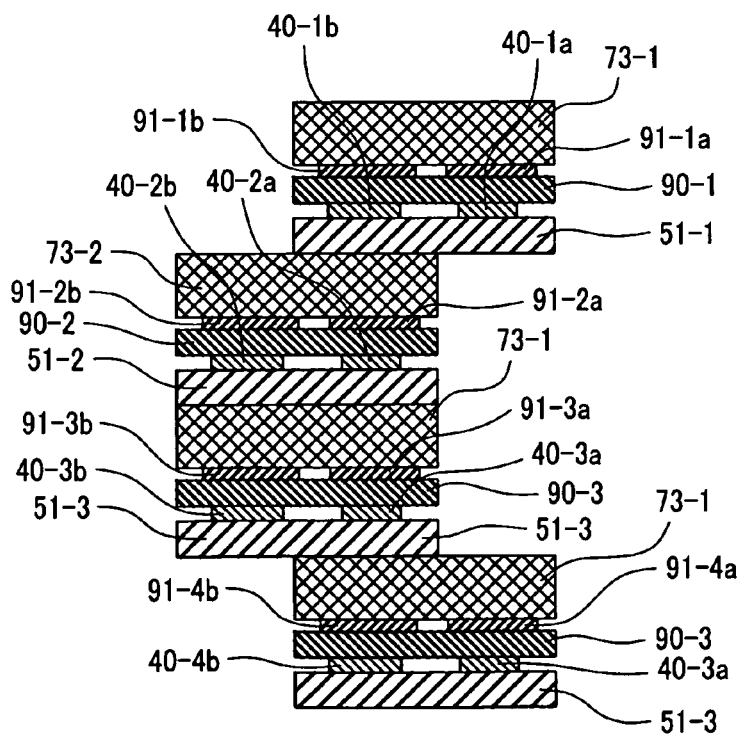
FIG. 13B is an enlarged plan view of the portion for capacitive coupling between the end extensions of the coils 40 and the line pattern of superconducting thin film on the wiring substrate 60.
Figure 14:
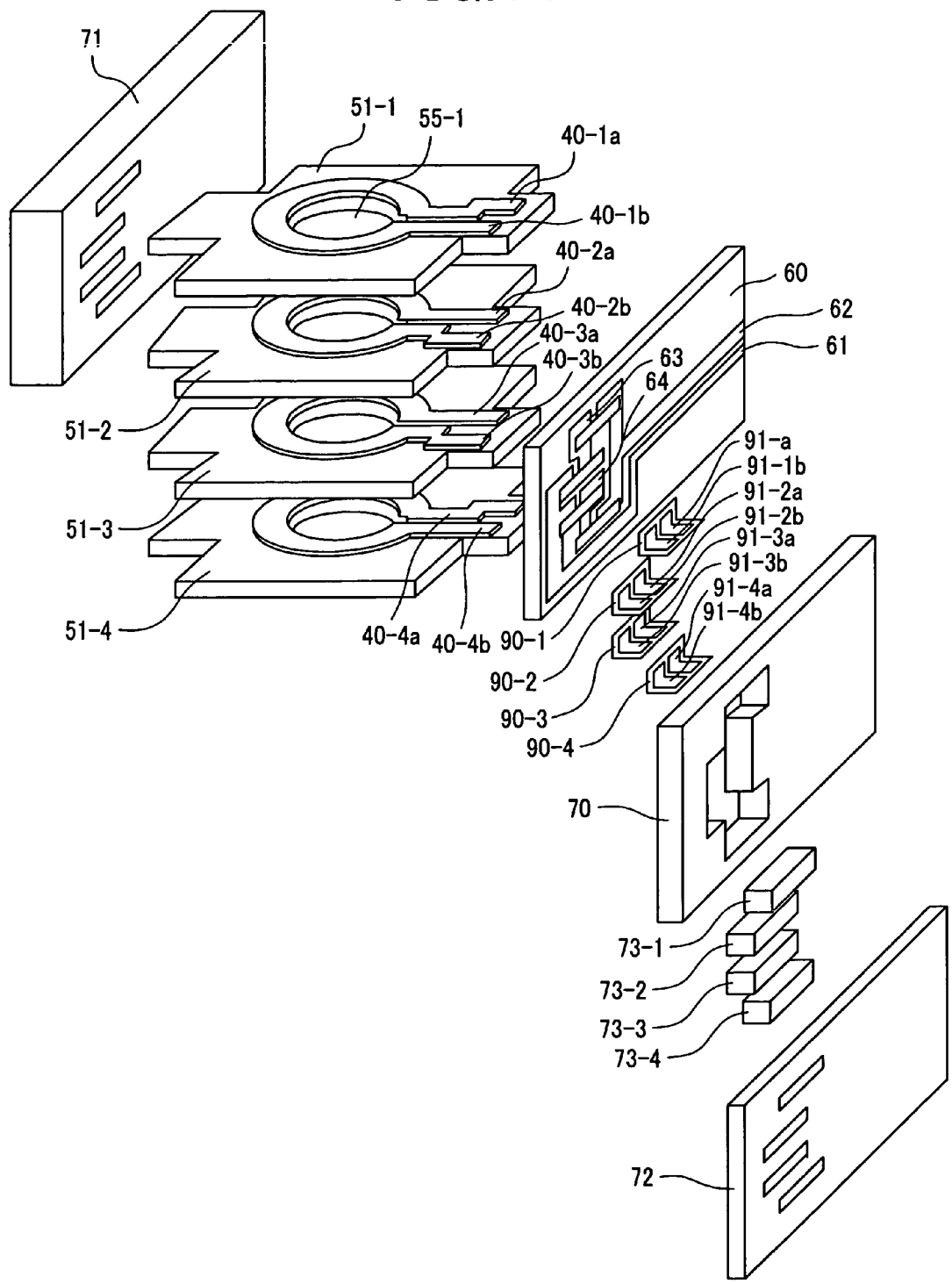
FIG. 14 is an exploded view showing various components in the fourth embodiment.
Figure 15A:
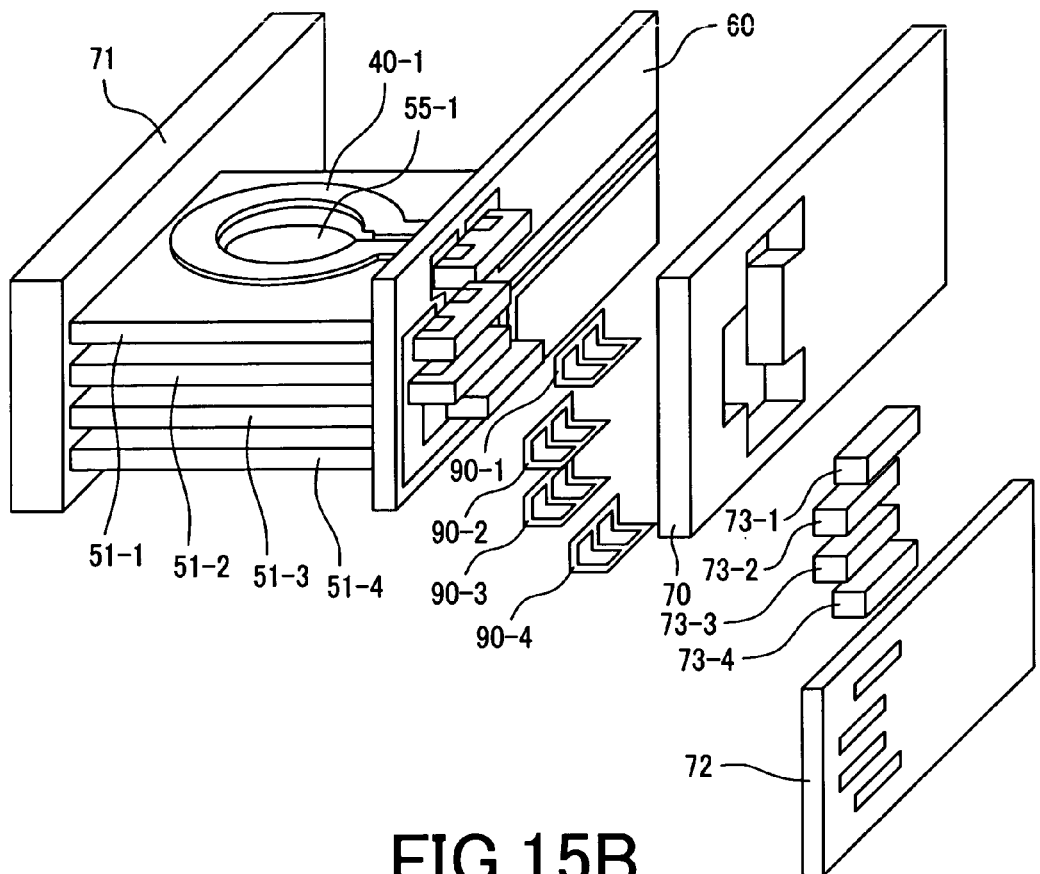
FIG. 15A shows the side holding plate 71, the coil substrates 51-1 to 51-4 and the wiring substrate 60 which are in assembled form, and other components in disassembled form
Figure 15B:
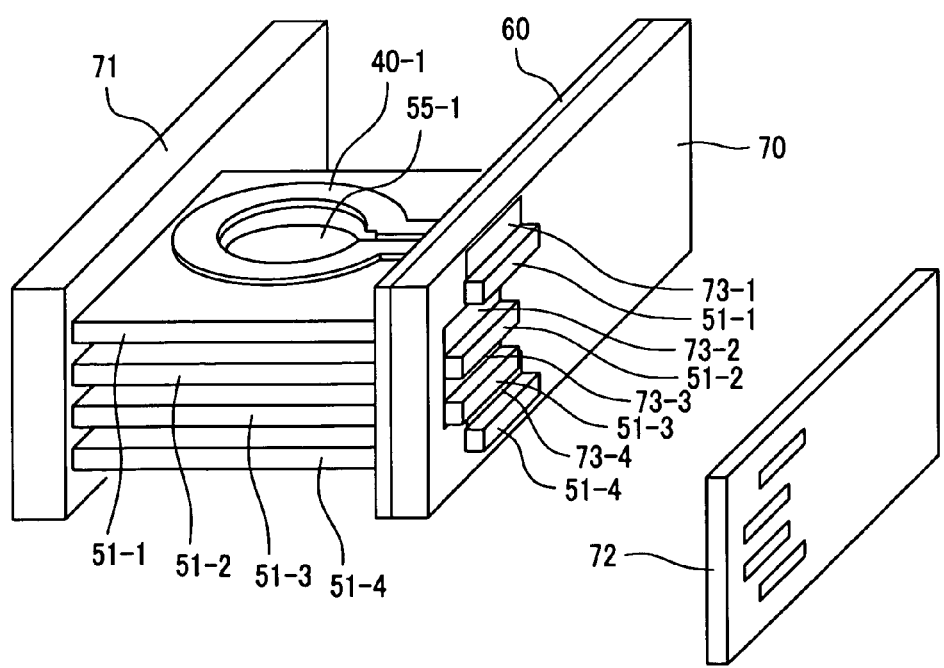
FIG. 15B shows that the side holding plate 70 is also assembled together and only the supporting plate 72 remains unassembled.
Figure 16:
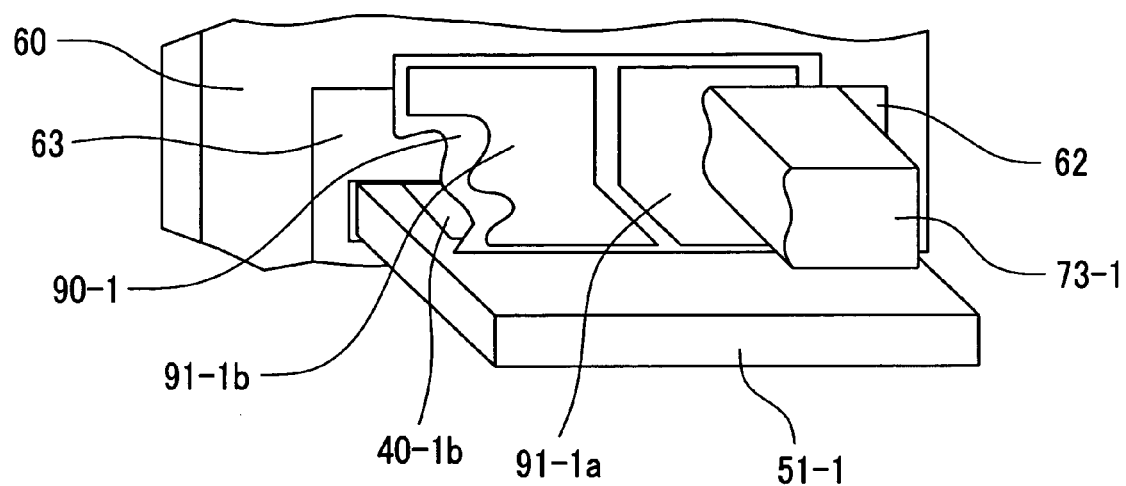
FIG. 16 is an enlarged perspective view which partially shows the portion for capacitive coupling between the end extension of the coil 40-1 and the line pattern of superconducting thin film on the wiring substrate 60.

FIG. 12A is a sectional view which shows the solenoid probe coil assembled with the coil substrates 51-1 to 51-4 the wiring substrate 60, side holding plates 70 and 71 and supporting plate 72, in the same manner as FIG. 6 for the first embodiment; and FIG. 12B is a plan view of the coil substrate 51-1 in the fourth embodiment. FIG. 13A is a plan view which shows the wiring substrate 60 with the side holding plate 70 and supporting plate 72 removed, in the same manner as FIG. 7 for the first embodiment; and FIG. 13B is an enlarged plan view of the portion for capacitive coupling between the end of extensions of the coils 40 and the line pattern on the wiring substrate 60. The fourth embodiment is different from the first to third embodiments in that the supporting plate 72 is provided, as explained later. FIG. 14 is an exploded view showing various components in the fourth embodiment. FIG. 15A shows the side holding plate 71, the coil substrates 51-1 to 51-4 and the wiring substrate 60 which are in assembled form, and other components in disassembled form; and FIG. 15B shows that the side holding plate 70 is also assembled together and only the supporting plate 72 remains unassembled. FIG. 16 is an enlarged perspective view which partially shows the portion for capacitive coupling between the end of extension of the coil 40-1 and the line pattern 62, 63 of the wiring substrate 60.

In the fourth embodiment, for capacitive coupling between the ends of the coils 40 and the line patterns 61 to 64 on the wiring substrate 60, it is unnecessary to provide a capacitive-coupled connection piece at the ends of the coils 40. Instead, as shown in FIG. 12B, the extension at the open ends of the coils 40 is longer than in the first to third embodiments and also, in order to more stabilize the capacitive coupling between the end extension of the coils 40 and the line patterns 61 to 64 on the wiring substrate 60, the corresponding projection of each substrate 51 is longer. For structural symmetry, the opposite projection of the substrate 51 is also longer. FIG. 12B shows the substrate 51-1 and the broken line in the projection portion represents the edge position of the projections of the substrates in the first to third embodiments. As can be understood by comparison between FIG. 12B and FIG. 4A, the fourth embodiment concerns a 2 turn 2 parallel coil like the first embodiment.

As can be understood by comparison between FIG. 12A and FIG. 6, in the fourth embodiment the coil substrates 51-1 to 51-4 are held stacked by the side holding plate 71 on the left and the wiring substrate 60 and side holding plate 70 on the right as well. However, in the fourth embodiment, the extensions of the coils 40-1 to 40-4 of the stacked coil substrates 51-1 to 51-4 are not connected with the line pattern of superconducting thin film of the wiring substrate 60; instead, superconducting thin films 91-1 to 91-4 deposited on flexible wiring sheets 90-1 to 90-4 are provided opposite to the extensions at the ends of the coils 40-1 to 40-4. These are held pressed by insulating holding blocks 73-1 to 73-4. The supporting plate 72 at the right side of the side holding plate 70 prevents the holding blocks 73-1 to 73-4 from coming off.

Referring to FIGS. 13A, 13B and 14, capacitive coupling between the end extensions of the coils 40 and the line patterns of superconducting thin films on the wiring substrate 60 will be explained below, taking the top coil substrate 51-1 as an example. There are extensions 40-1a and 40-1b of the coil 40-1 on the coil substrate 51-1. A flexible wiring sheet with 90-1 lies over them. The flexible wiring sheet 90-1 has superconducting thin films 91-1a and 91-1b deposited in a way to face the extensions 40-1a and 40-1b. Since the wiring patterns of the wiring substrate 60 are designed to match the coils 40 to be connected with them, the superconducting thin films 91-1a and 91-1b also face the line patterns of superconducting thin films 62 and 63 of the wiring substrate 60, as in the first embodiment. In other words, the extensions 40-1a and 40-1b of the coil 40-1 are capacitively coupled to the line patterns of superconducting thin films 62 and 63 of the wiring substrate 60 through the organic insulator sheet (flexible wiring sheet 90-1). This configuration is same in the other coil substrates 51-2 to 51-4.

As shown in FIG. 15A, after the side holding plate 71, coil substrates 51-1 to 51-4 and wiring substrate 60 are assembled together, the flexible wiring 90-1 to 90-4 are put on the extensions of the coils 40 on the coil substrates 51-1 to 51-4 which protrude through the holes of the wiring substrate 60. As apparent by comparison with FIG. 3B, in the fourth embodiment the holes of the side holding plate 70 not only serve as passages for the projections of the coil substrates 51 but also support the holding blocks 73-1 to 73-4 and are therefore considered to be holes for supporting the portion as illustrated in FIG. 13B. Then, as shown in FIG. 15B, the holding blocks 73-1 to 73-4 are inserted to finish assembling the side holding plate 70. Details of the projections of the coil substrates 51 in this condition are illustrated in FIG. 13B. Details of the flexible wiring sheets are illustrated in FIG. 16, taking the coil substrate 51-1 as an example. The superconducting thin films 91-1a and 91-b on the flexible wiring sheet 90-1 respectively face the extensions 40-1a (not shown) and 40-1b of the coil 40-1 and also face the line patterns of superconducting thin films 62 and 63 on the wiring substrate 60 so as to achieve capacitive coupling between the end of extension of the coil 40-1 and line patterns of superconducting thin films on the wiring substrate 60. Next, the supporting plate 72 is assembled to complete the probe coil.

As in the above embodiments, in the fourth embodiment, a $MgB_2$ superconducting thin film with a thickness of 200 nm is made on each of the coil substrates 51-1 to 51-4 by evaporation method. The material of the substrate is sapphire. Then, washer type superconducting thin film coils 40 with an extension are made by patterning using photolithography and electron cyclotron resonance etching. Lastly, laser light irradiation is done to make holes 55 (into which the sample tube 30 containing sample is inserted) and finish the contours of the coil substrates 51.

Each of the flexible wiring sheets 90-1 to 90-4 consists of a superconducting thin film (91-1 to 91-4 respectively) on an organic sheet. The organic material employed is polytetrafluoroethylene with a thickness of 20 μm. The superconducting material employed is $MgB_2$, a material which can be deposited on different types of substrates. A $MgB_2$ superconducting thin film with a thickness of 200 nm is made on the organic sheet by evaporation method. Then, line patterns of superconducting thin films 91-1a to 91-4b are made by using photolithography and electron cyclotron resonance etching in a way that the sheet is divided into two equal parts at its centerline.

The side holding plates 70 and 71 and the supporting plate 72 are made of the same material as the coil substrates 51, namely sapphire. The thickness of the side holding plate 71 is equal to the sum of that of the side holding plate 70, that of the wiring substrate 60 and that of the supporting plate 72. Also, holes are made in the side holding plates 70 and 71 and the supporting plate 72 by laser light irradiation.

The holding blocks 73-1 to 73-4 are also made of the same material as the coil substrates 51, namely sapphire. The wiring substrate 60 is made by the same method as in the first embodiment. The projections of the coil substrates 51-1 to 51-4 and the holes in the side holding plates 70 and 71, the supporting plate 72 and the wiring substrate 60 are thermally and mechanically joined by indium deposition.

As a result of evaluating the prepared 2 turn 2 parallel solenoid coil at 600 MHz, it was found that the sensitivity is 3.5 times higher than when normal metal coil is used, like the coil in the first embodiment. The fourth embodiment uses $MgB_2$ as the material for the superconducting thin film coil. Similar result was obtained when an oxide high-temperature superconductor such as YBCO was employed instead. Also, when aluminum nitride (AlN) was used instead of sapphire for the coil substrates 51-1 to 51-4, side holding plates 70 and 71 and supporting plate 72, wiring substrate 60 and holding blocks 73-1 to 73-4, the result was similar. Furthermore, even when polyimide was used as the organic material for the flexible wiring sheets 90, the result was similar.

Fifth Embodiment

The fifth embodiment proposes a cryogenic probe 20 which can be inserted vertically to the static magnetic field (in the x direction).

FIG. 17 is a perspective view of a solenoid probe coil for NMR spectroscopy according to the fifth embodiment. Coil substrates 51-1 to 51-4, the used materials, the fabrication methods of various components, and the assembling and connection procedures are the same as in the first embodiment.

FIG. 18 illustrates the line patterns of superconducting thin films 61 to 64 and the connection pieces 54-1 to 54-4 and 54-1' to 54-4' on the four coil substrates 51-1 to 51-4 by way of example. The figure corresponds to FIG. 7 for the first embodiment and suggests that the fifth embodiment also realizes a 2 turn 2 parallel solenoid coil.

As a result of evaluating the prepared 2 turn 2 parallel solenoid coil at 600 MHz, it was found that the sensitivity is 3.5 times higher than when normal metal coil is used. Also the fifth embodiment uses $MgB_2$ as the superconducting thin film material. Similar result was obtained when an oxide high-temperature superconductor such as YBCO was employed for the same structure. Also, when aluminum nitride (AlN) was used instead of sapphire for the coil substrates 51, the wiring substrate 60 and the side holding plates 70 and 71, the result was similar.

Sixth Embodiment

Figure 19A:
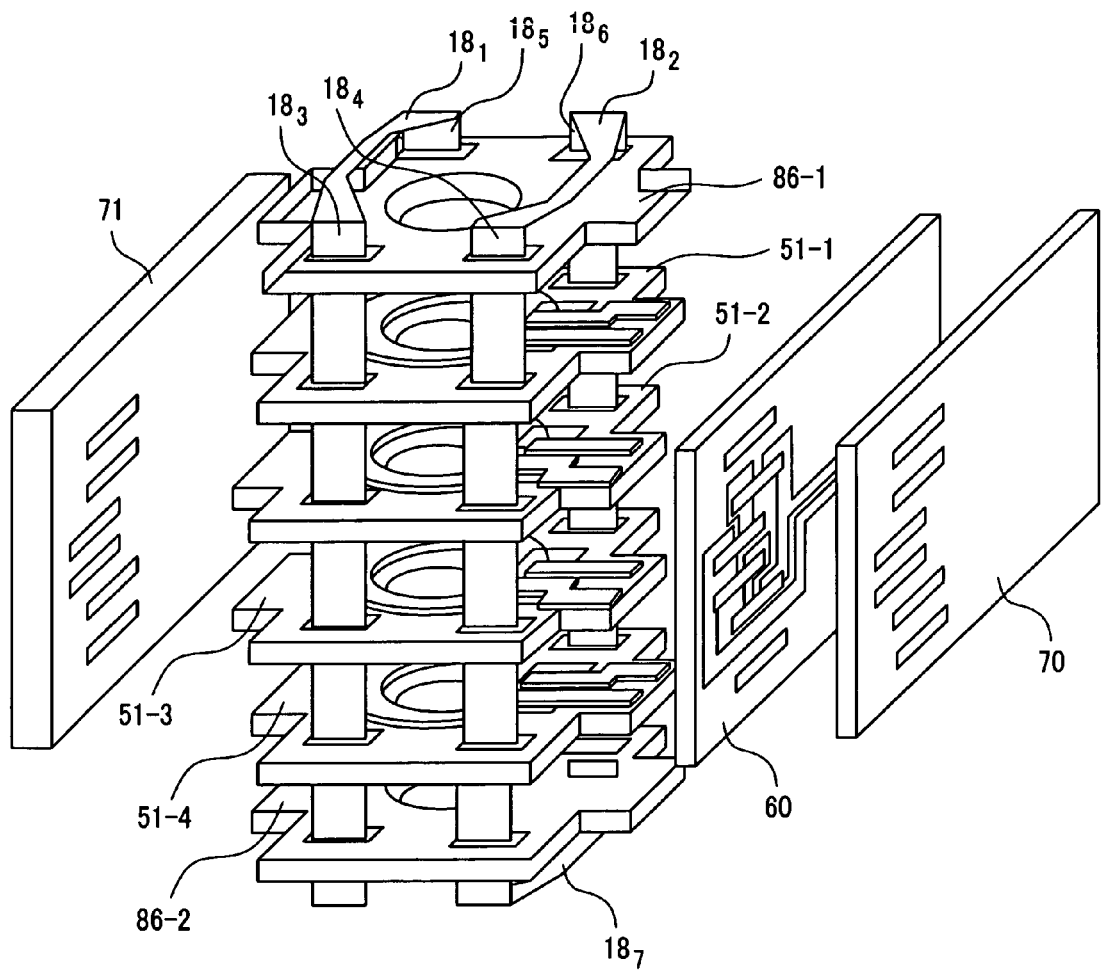
FIG. 19A is a perspective view which schematically shows an example of the probe coil 50 according to the first embodiment with which the transmitter coil described in reference to FIG. 2 is combined.
Figure 19B:
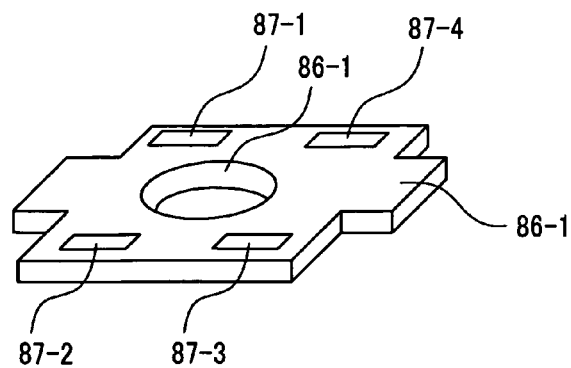
FIG. 19B is a perspective view which schematically shows a guard plate used for fitting the transmitter coil.

FIG. 19A is a perspective view which schematically shows an example of the probe coil 50 according to the first embodiment, with which the transmitter coil described in reference to FIG. 2 is combined; and FIG. 19B is a perspective view which schematically shows a guard plate used for fitting the transmitter coil. Although the basic structure of the probe coil, which includes the coil substrates 51, wiring substrate 60 and side holding plates 70 and 71, is the same as described so far, as can be understood by comparison with FIG. 2 and FIG. 3B, the sixth embodiment is different in that guard plates 86-1 and 86-2 are provided on the upper face of the coil substrate 51-1 and the lower face of the coil substrate 51-4 respectively and the coil substrates 51 and the guard plates 86 have holes for passage of coil pieces of the transmitter coil. The coil pieces of the transmitter coil are made of normal metal. As shown in FIG. 19B, 87-1 to 87-4 represent holes through which the coil pieces of the transmitter coil pass. The same holes as those in the guard plates 86 are made in the coil substrates 51 in the same positions. The guard plates 86 are made of the same material by the same method as the coil substrates 51. It is needless to say that the wiring substrate 60 and the side holding plates 70 and 71 should be lengthened for the guard plates 86-1 and 86-2 and also should have holes for passage of the projections of the guard plates 86 which correspond to the holes for passage of the projections of the coil substrates 51.

After coil pieces $18_1$ and $18_2$ of the transmitter coil as described in reference to FIG. 2 are placed on the top guard plate 86-1, coil pieces $18_3$ and $18_5$ and coil pieces $18_4$ and $18_6$ are respectively passed through the holes 87-1 to 87-4 beneath the coil pieces $18_1$ and $18_2$ so that they stand in a manner to make up a saddle type coil. The coil pieces $18_3$ and $18_5$ and coil pieces $18_4$ and $18_6$ are led through the holes 87-1 to 87-4 of the bottom guard plate 86-2 to the lower face of the bottom guard plate 86-2 and combined with other coil pieces to make up a saddle type coil. As described in reference to FIG. 2, the transmitter coil 18 substantially consists of two 1 turn coils connected in parallel in a way to surround the receiver coil: namely a 1 turn coil composed of coil pieces $18_1$, $18_3$, $18_5$ and $18_8$ and a 1 turn coil composed of coil pieces $18_2$, $18_4$, $18_6$ and $18_7$. A large pulse current is supplied from the transmitter circuit 23 to the transmitter coil 18 through the normal metal leading wire 17' from the coil pieces $18_9$ and $18_{10}$ connecting two 1 turn coils so that the sample inserted in the space formed by the receiver coil generates a magnetic moment component perpendicular to the static magnetic field. How the normal metal leading wire 17' is led to the cold head 21 is not concretely explained here but one possible approach is to lay it along the side holding plate 71 like the line patterns 61 and 62 of the wiring substrate 60.

Seventh Embodiment

Figure 20:
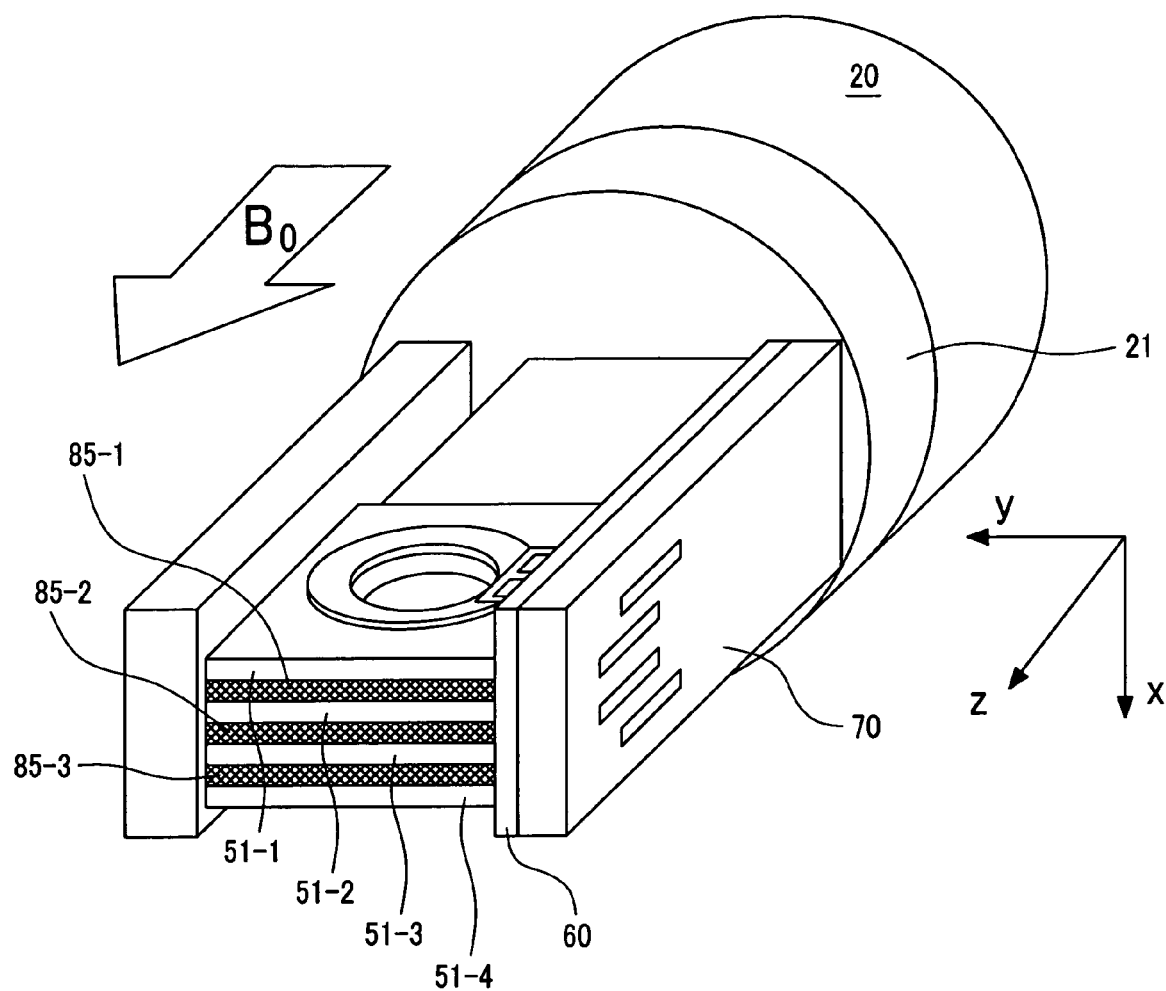
FIG. 20 is a perspective view which schematically shows that in the probe coil 50 composed of the coil substrates 51, wiring substrate 60 and side holding plates 70 and 71, spacers are inserted between the coil substrates 51.

FIG. 20 is a perspective view which schematically shows that in the probe coil 50 composed of the coil substrates 51, wiring substrate 60 and side holding plates 70 and 71, spacers 85-1 to 85-3 are inserted between the coil substrates 51. The basic structure of the embodiment is the same as the first embodiment but it is different in that the spacers 85-1 to 85-3 are inserted between the coil substrates 51. The spacers 85-1 to 85-3 are made of the same material by the same method as the coil substrates 51. Since they are fitted just by inserting them between the wiring substrate 60 and the side holding plate 71, the projections are unnecessary and therefore the wiring substrate 60 and side holding plates 70 and 71 need not have holes.

The spacers 85-1 to 85-3 are thermally connected with the coil substrates 51, for example, by indium deposition. When they reach the cold head 21, the cooling effect on the coil substrates 51 is increased.

As explained so far, the present invention realizes an NMR spectrometer which allows a solenoid superconducting probe coil applicable to a split magnet to be inserted vertically or horizontally to a static magnetic field. The substrates on which element coils of the probe coil are formed are fixed by side plates for supporting the multilayer structure, and wiring between element coils is made by a wiring substrate which is arranged in the same manner as the side plates, leading to manufacturing ease. According to the present invention, the probe coil is a superconducting solenoid coil. Consequently, due to the use of superconducting thin films, thermal noise and surface resistance are reduced and the sensitivity is improved. The solenoid coil form increases the sample filling factor and thereby improves the sensitivity.

What is claimed is:

1. A nuclear magnetic resonance spectrometer comprising:

means for generating a prescribed static magnetic field; and a probe placed in the magnetic field, in which a sample tube containing sample to be measured can be inserted or removed, the magnetic field generating means comprising:

a superconducting magnet split in half which allows the probe to be inserted vertically or horizontally to a magnetic field generated by the superconducting magnet, the probe comprising:

a plurality of coil substrates on which a superconducting thin film coil with a shape of partially open 1 turn coil is formed; and a wiring substrate on which line patterns of superconducting thin films with a prescribed circuit pattern are formed, wherein the plural coil substrates and the wiring substrate are coupled so as to form a prescribed circuit configuration by capacitively coupling the open ends of the superconducting thin film coil and part of the line pattern of superconducting thin film; and wherein the edges of the plural coil substrates coupled with the wiring substrate are fixed by a side holding plate coupled with the other edges of the coil substrates, and a side holding plate provided to a side surface of the wiring substrate.

2. A probe coil comprising:

a plurality of coil substrates on which a superconducting thin film coil with a shape of partially open 1 turn coil is formed;

a wiring substrate on which line patterns of superconducting thin films with a prescribed circuit pattern are formed, wherein the plural coil substrates and the wiring substrate are coupled so as to form a prescribed circuit configuration by capacitively coupling the open ends of the superconducting thin film coil and part of the line pattern of superconducting thin film; and wherein the edges of the plural coil substrates coupled with the wiring substrate are fixed by a side holding plate coupled with the other edges of the coil substrates, and a side holding plate provided to a side surface of the wiring substrate.

3. The probe coil according to claim 2, wherein the capacitive coupling is made between an insulating layer covering the extensions of the open ends of the superconducting thin film coil and a connection piece as a superconducting thin film deposited on the layer, and the connection piece and part of the line pattern of superconducting thin film are connected to form a prescribed circuit configuration.

4. The probe coil according to claim 2, wherein the capacitive coupling is made by a superconducting thin film which faces the extensions of the open ends of the superconducting thin film coil and part of the line pattern of superconducting thin film through an insulating thin film.

5. The probe coil according to claim 2, wherein the coil substrates each have projections at the substrate edge on the side of the open ends of the superconducting thin film coil and also at the opposite edge; the wiring substrate and the side holding plates each have holes in the positions corresponding to the projections of the coil substrates; and the coil substrates are coupled with the wiring substrate and the side holding plates and fixed by engaging the projections with the holes.

6. The probe coil according to claim 5, wherein in the coil substrate, the length from the center of the substrate to one projection edge is equal to that to the other projection edge; and the sum of the thickness of the wiring substrate and the thickness of the side holding plate, on the side of the superconducting thin film coil open ends of the coil substrate, is almost equal to the thickness of the side holding plate on the other side of the coil substrate.

7. The probe coil according to claim 5, wherein an extension of each of the open ends of the superconducting thin film coil is formed on a projection of each of the coil substrates; capacitive coupling is made by a superconducting thin film facing of part of the extensions and part of the line pattern of superconducting thin film through an insulating thin film; and the insulating thin film is supported by a holding block which is located between the projection of the coil substrate and the holes corresponding to the projection, in the wiring substrate and the side holding plate outside of it.

8. The probe coil according to claim 5, wherein a supporting plate is added to hold the holding block in a prescribed position of the side holding plate.

9. The probe coil according to claim 5, wherein in the coil substrate, the projection at the substrate edge on which the open ends of the superconducting thin film coil are formed and the projection at the other edge each take the form of an edge with a cut only in one corner; and the holes in the wiring substrate and the side holding plates, located in positions corresponding to the projections, extend up to the edge ends of the wiring substrate and the side holding plates.

10. The probe coil according to claim 2, wherein spacers lie between the plural coil substrates.

11. The probe coil according to claim 2, wherein the material of the superconducting thin film coil and the line pattern of superconducting thin film is metal Nb or Nb compound such as NbTi or $Nb_3Al$, or lead alloy such as Pb or PbIn, or copper-oxide superconductor such as YBCO, or magnesium diboride ($MgB_2$); and the material of the coil substrates, the side holding plates and the wiring substrate is sapphire ($Al_2O_3$), $LaAlO_3$, LSAT, MgO, AlN or polytetrafluoroethylene.

12. A probe coil comprising:

a plurality of coil substrates on which a superconducting thin film coil with a shape of partially open 1 turn coil is formed and a plurality of holes for transmitter coil pieces are formed;

a wiring substrate on which a line patterns of superconducting thin films with a prescribed circuit pattern are formed; and insulating substrates which are located above and below the coil substrates and have a plurality of holes for transmitter coil pieces, identical to the holes in the coil substrates, wherein the plural coil substrates and the wiring substrate are coupled so as to form a prescribed circuit configuration by capacitive coupling of the open ends of the superconducting thin film coil and part of the line pattern of superconducting thin film;

wherein transmitter coil pieces are assembled into a transmitter coil using the plural holes in the top and bottom insulating substrates; and wherein the edges of the plural coil substrates coupled with the wiring substrate are fixed by a side holding plate coupled with the other edges of the coil substrates, and a side holding plate provided to a side surface of the wiring substrate.

13. The probe coil according to claim 12, wherein spacers lie between the plural coil substrates.

14. The probe coil according to claim 12, wherein the material of the superconducting thin film coil and the line pattern of superconducting thin film is metal Nb or Nb compound such as NbTi or $Nb_3Al$, or lead alloy such as Pb or PbIn, or copper-oxide superconductor such as YBCO, or magnesium diboride ($MgB_2$); and the material of the coil substrates, the side holding plates and the wiring substrate is sapphire ($Al_2O_3$), $LaAlO_3$, LSAT, MgO, AlN or polytetrafluoroethylene.

* * * * *